United States Patent
Takayama et al.

(10) Patent No.: US 7,226,822 B2
(45) Date of Patent: Jun. 5, 2007

(54) WIRING MATERIAL, SEMICONDUCTOR DEVICE PROVIDED WITH A WIRING USING THE WIRING MATERIAL AND METHOD OF MANUFACTURING THEREOF

(75) Inventors: Toru Takayama, Kanagawa (JP); Keiji Sato, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 9 days.

(21) Appl. No.: 10/672,521

(22) Filed: Sep. 26, 2003

(65) Prior Publication Data

US 2004/0108599 A1 Jun. 10, 2004

Related U.S. Application Data

(62) Division of application No. 09/604,997, filed on Nov. 21, 2000, now Pat. No. 6,661,096.

(30) Foreign Application Priority Data

Jun. 29, 1999 (JP) .................................. 11-183258
Jun. 28, 2000 (JP) ............................. 2000-194104

(51) Int. Cl.
*H01L 21/00* (2006.01)
(52) U.S. Cl. ....................... 438/151; 438/149; 438/166; 257/E21.409
(58) Field of Classification Search ................ 438/685, 438/669, 658, 798, 648, 656
See application file for complete search history.

(56) References Cited

U.S. PATENT DOCUMENTS 4,619,695 A * 10/1986 Oikawa et al. ............ 75/10.65

(Continued)

FOREIGN PATENT DOCUMENTS

JP  05-263226  10/1993

(Continued)

OTHER PUBLICATIONS

Hoffman et al, "The Compressive Stress Transition in Al, V, Zr, Nb and W Metal Films Sputtered at Low Working Pressures," Thin Film Solids, vol. 45, pp. 387-396 (1977).

(Continued)

*Primary Examiner*—Michael Lebentritt
*Assistant Examiner*—Cheung Lee
(74) *Attorney, Agent, or Firm*—Cook, Alex, McFarron, Manzo, Cummings & Mehler, Ltd.

(57) ABSTRACT

By using a high purity target as a target, using a single gas, argon (Ar), as a sputtering gas, setting the substrate temperature at 300° C. or less, setting the sputtering power from 1 kW to 9 kW, and setting the sputtering gas pressure from 1.0 Pa to 3.0 Pa, the film stress of a film is made from $-1\times10^{10}$ dyn/cm$^2$ to $1\times10^{10}$ dyn/cm$^2$. By thus using a conducting film in which the amount of sodium contained within the film is equal to or less than 0.03 ppm, preferably equal to or less than 0.01 ppm, and having a low electrical resistivity (equal to or less than 40 μΩ·cm), as a gate wiring material and a material for other wirings of a TFT, the operating performance and the reliability of a semiconductor device provided with the TFT can be increased.

20 Claims, 23 Drawing Sheets

U.S. PATENT DOCUMENTS

| | | | |
|---|---|---|---|
| 4,770,948 A | | 9/1988 | Oikawa et al. |
| 5,208,170 A | * | 5/1993 | Kobeda et al. ............. 438/625 |
| 5,341,016 A | | 8/1994 | Prall et al. .................. 257/412 |
| 5,477,359 A | | 12/1995 | Okazaki |
| 5,594,569 A | | 1/1997 | Konuma et al. ............ 349/122 |
| 5,643,826 A | | 7/1997 | Ohtani et al. ................. 437/88 |
| 5,667,665 A | * | 9/1997 | Shindo et al. .............. 205/589 |
| 5,738,948 A | | 4/1998 | Ikeda et al. |
| 5,840,366 A | * | 11/1998 | Mizuno et al. ............. 427/250 |
| 5,923,962 A | | 7/1999 | Ohtani et al. ............... 438/150 |
| 6,078,071 A | * | 6/2000 | Matsuda ..................... 257/280 |
| 6,245,668 B1 | * | 6/2001 | Brodsky et al. ............ 438/627 |
| 6,285,042 B1 | | 9/2001 | Ohtani et al. ................. 257/66 |
| 6,335,541 B1 | | 1/2002 | Ohtani et al. ................. 257/59 |

FOREIGN PATENT DOCUMENTS

| | | |
|---|---|---|
| JP | 07-130652 | 5/1995 |
| JP | 08-153722 | 6/1996 |
| JP | 408153722 A * | 6/1996 |

OTHER PUBLICATIONS

Yoshida, et al., "A Full-Color Thresholdless Antiferroelectric LCD Exhibiting Wide Viewing Angle With Fast Response Time," *SID 97 Digest*. pp. 841-844 (1997).

Furue et al., "Characteristic and Driving Scheme of Polymer-Stabilized Monostable FLCD Exhibiting Fast Response Time and High Contrast Ratio with Gray-Scale Capability," *SID 98 Digest*. pp. 782-785 (1998).

Pending U.S. Appl. No. 09/598,736 to Takayama et al., including specification claims, abstract, drawings and PTO filing receipt.

Pending U.S. Appl. No. 09/527,437 to Yamazaki et al. filed Mar. 16, 2000, including specification, claims, abstract, drawings and PTO filing receipt.

PTO office action re U.S. Appl. No. 09/598,736, dated Mar. 21, 2005.

Amendment D (w/pending claims) re U.S. Appl. No. 09/598,736, dated Jun. 21, 2005.

* cited by examiner

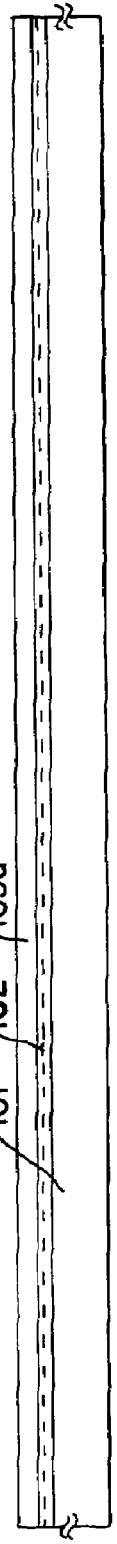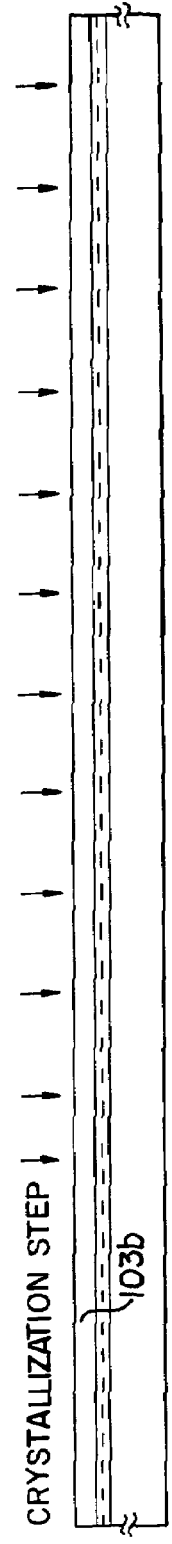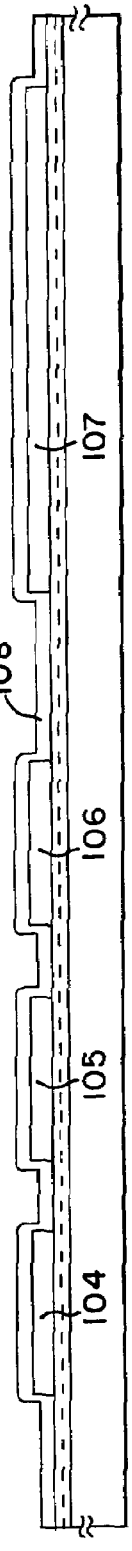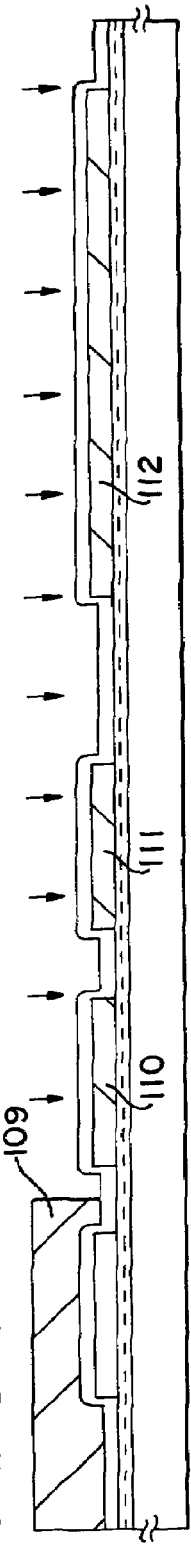

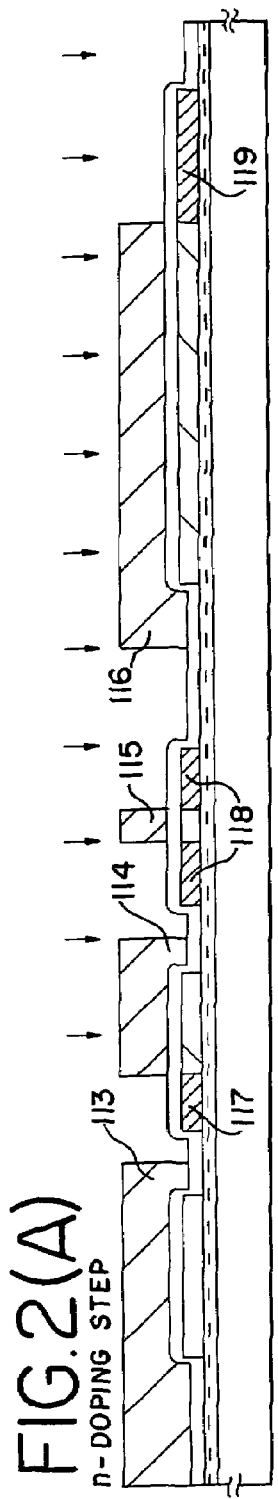

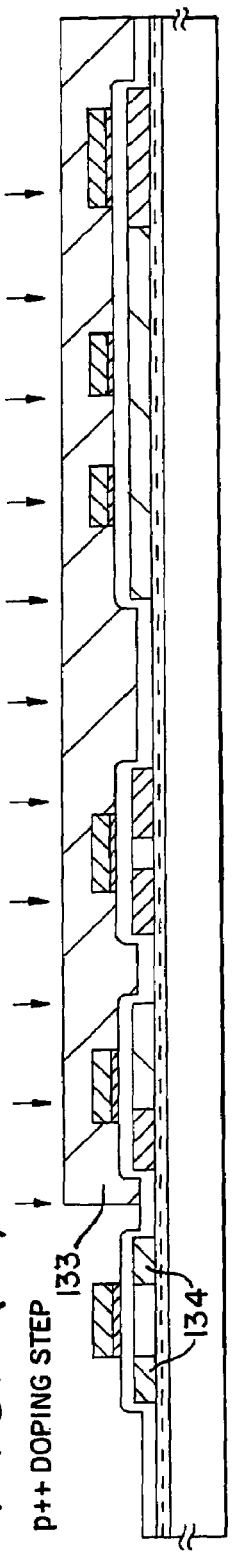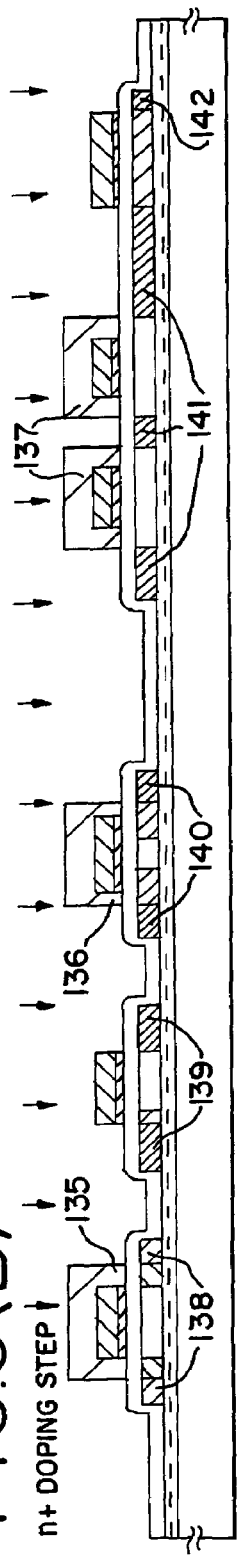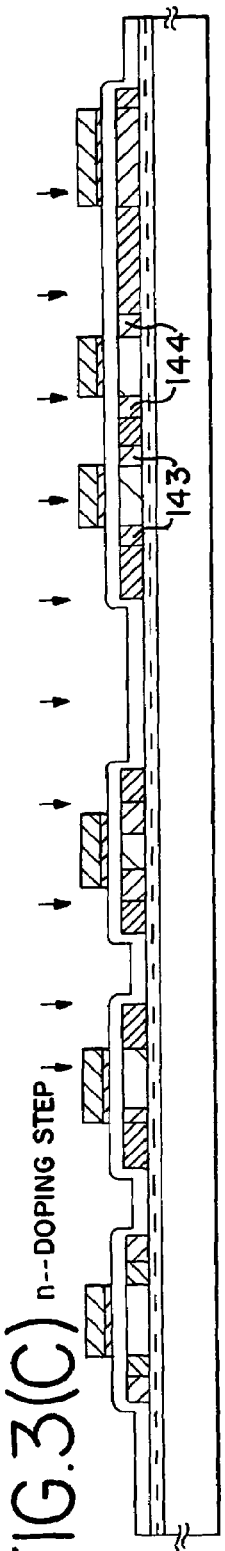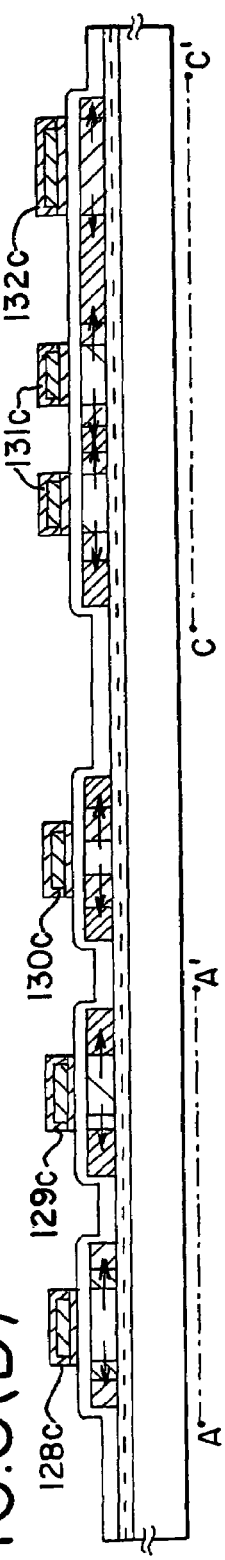

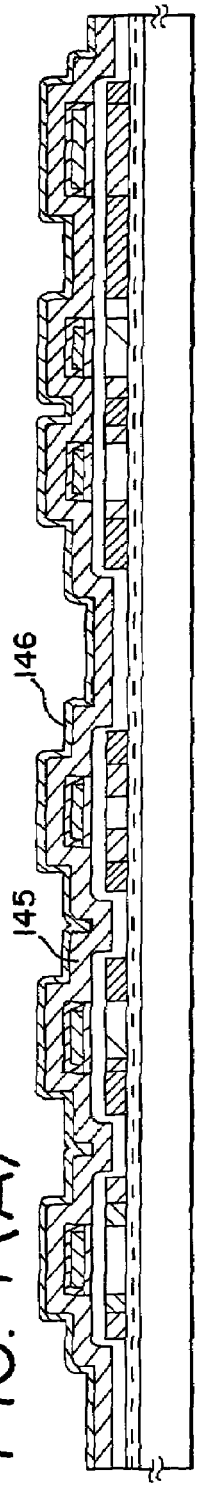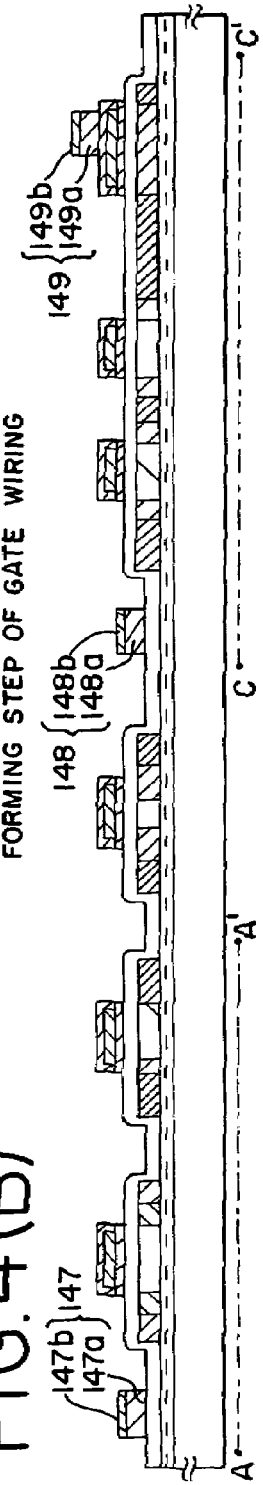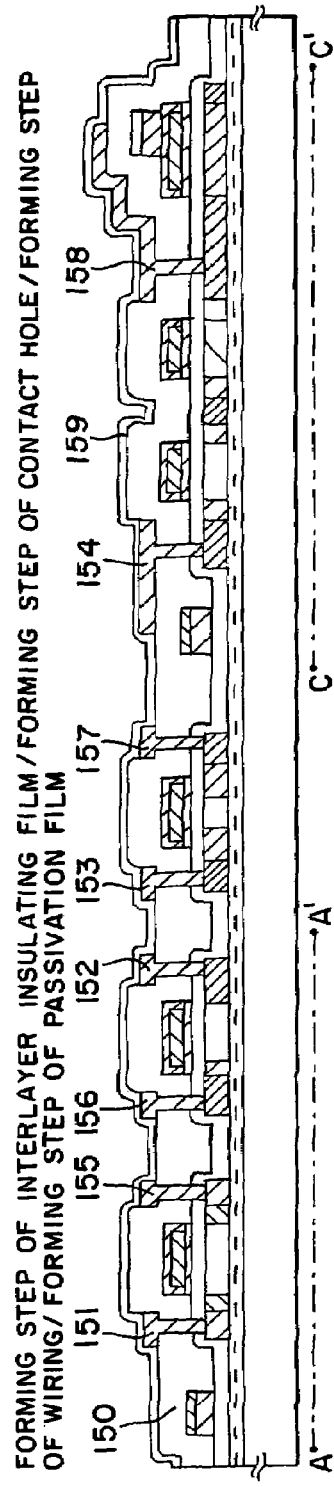

FORMING STEP OF RESIN FILM / FORMING STEP OF CONTACT HOLE / FORMING STEP OF PIXEL ELECTRODE

FIG. 24(A)
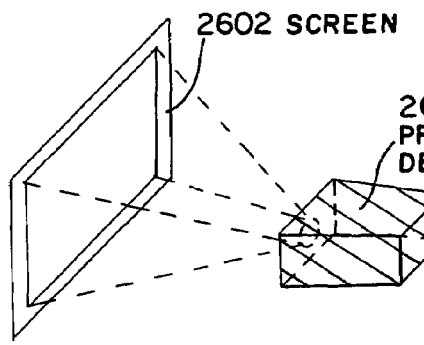
FIG. 24(B)
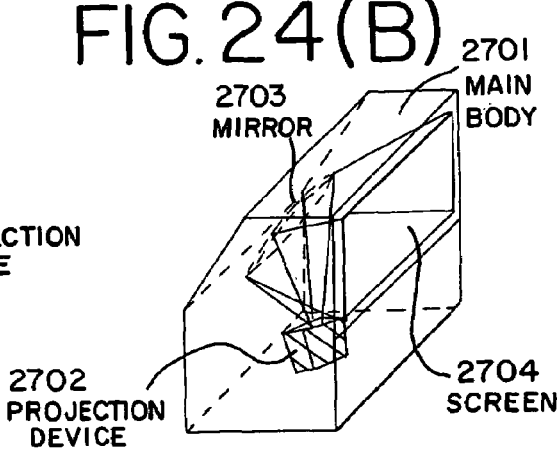
FIG. 24(C) PROJECTION DEVICE (THREE-PLATE STYLE) TOWARD SCREEN
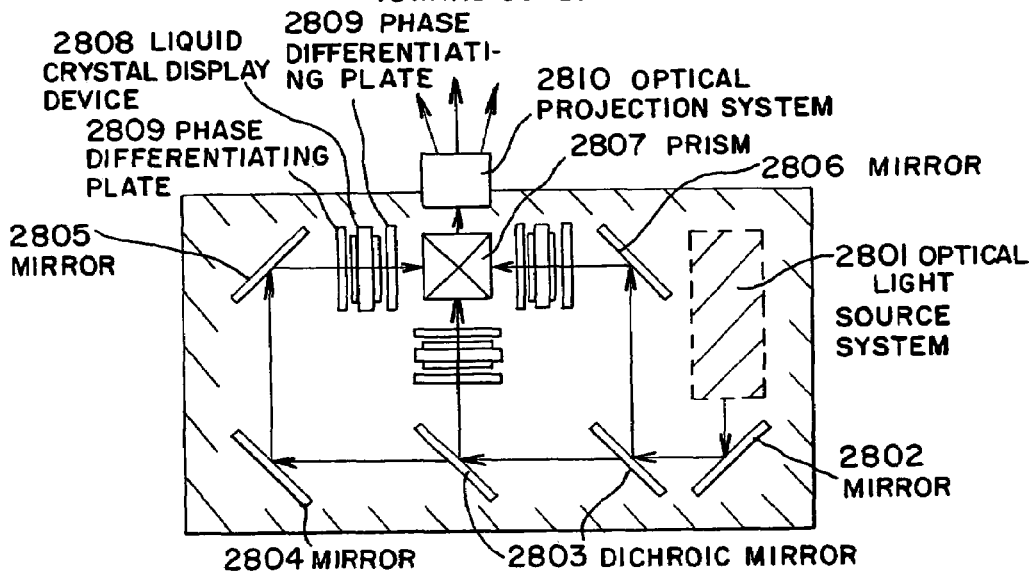
FIG. 24(D) OPTICAL LIGHT SOURCE SYSTEM
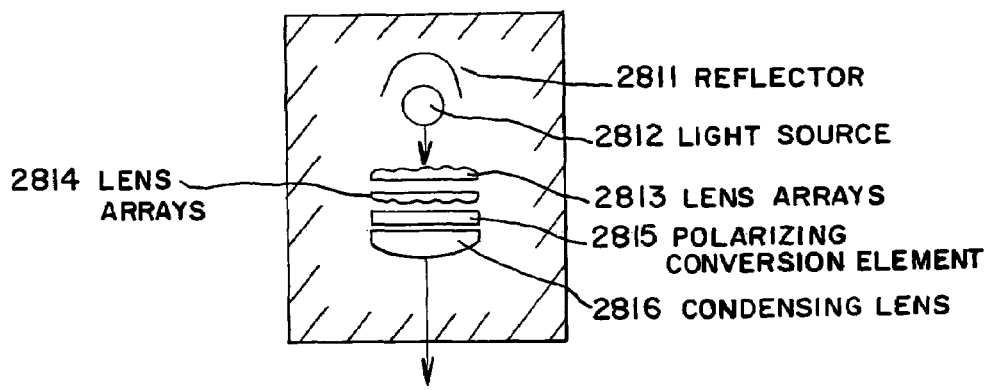

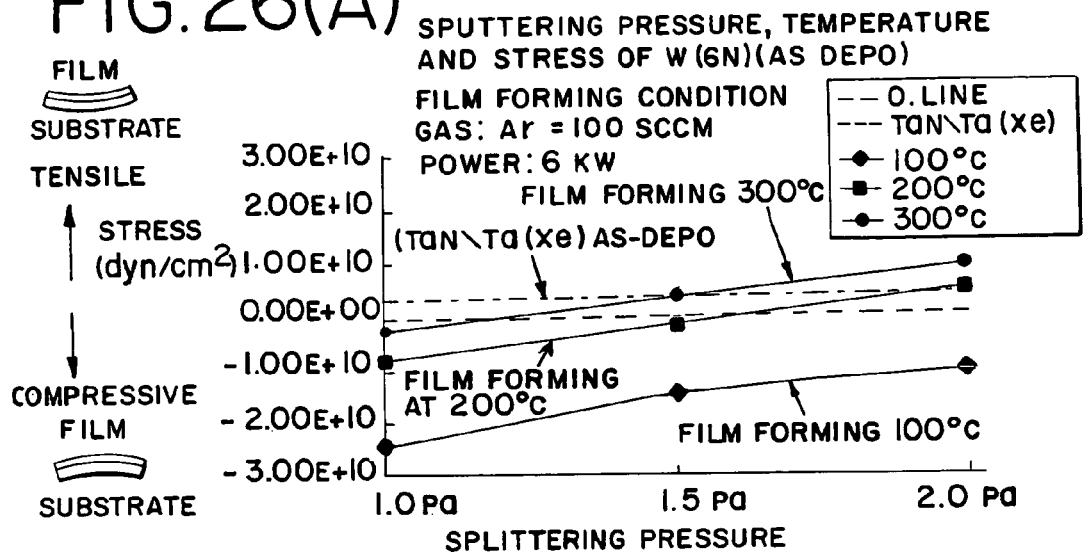
FIG.26(A) SPUTTERING PRESSURE, TEMPERATURE AND STRESS OF W(6N)(AS DEPO)
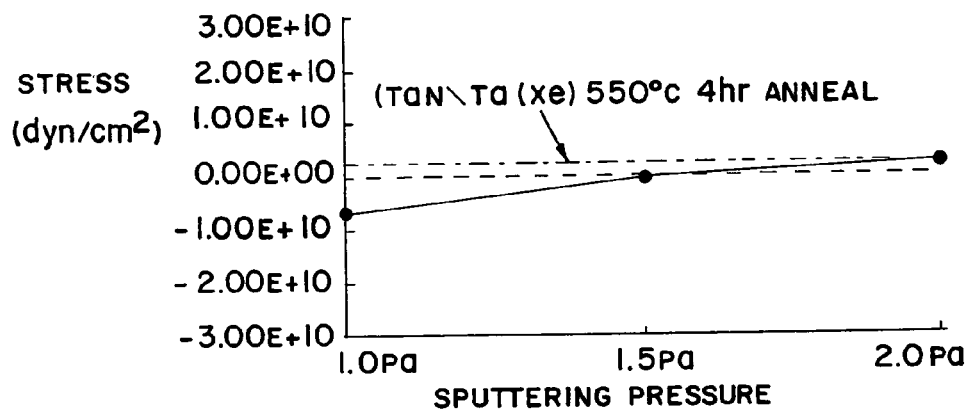
FIG.26(B) SPUTTERING PRESSURE AND STRESS OF W(6N)
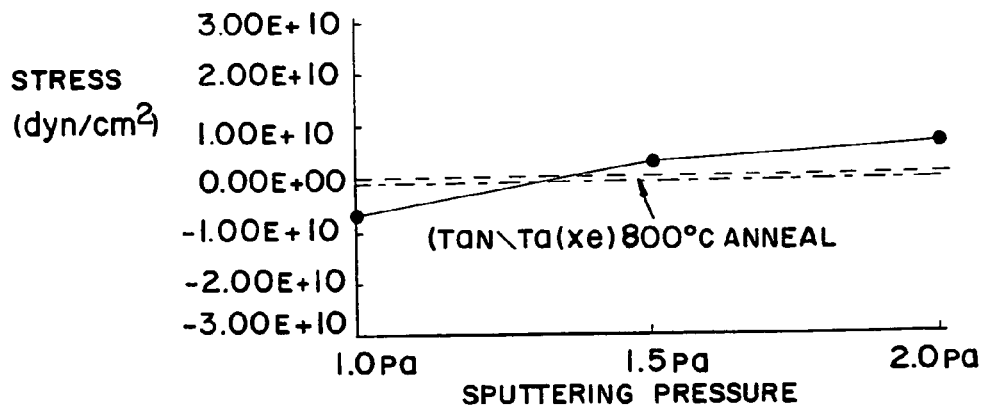
FIG.26(C) SPUTTERING PRESSURE AND STRESS OF W(6N) (800°C 1hr ANNEAL)

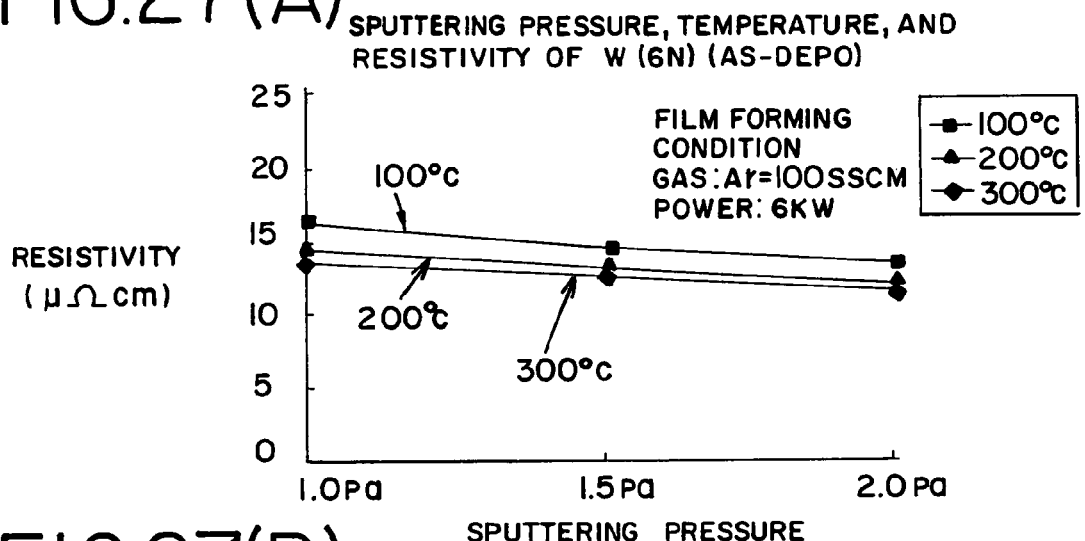
FIG.27(A) SPUTTERING PRESSURE, TEMPERATURE, AND RESISTIVITY OF W (6N) (AS-DEPO)
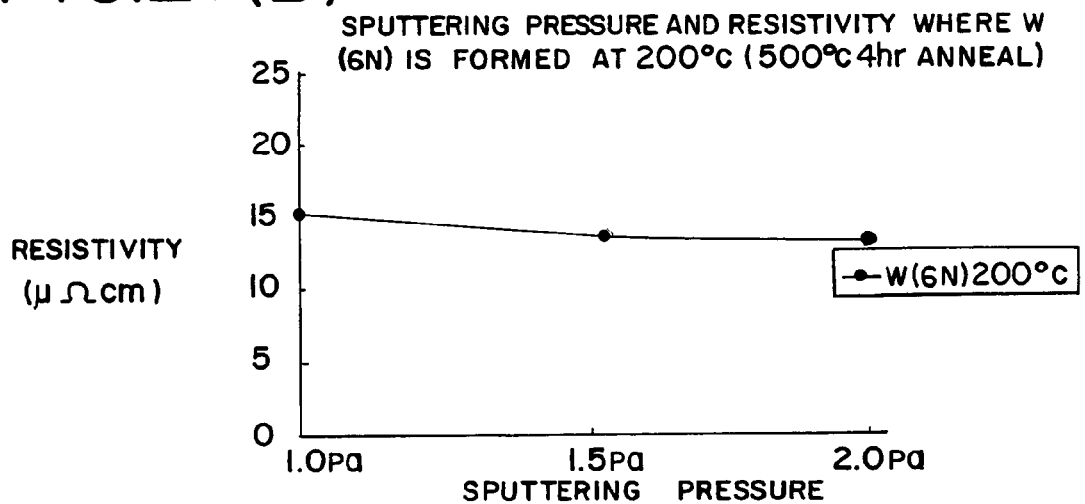
FIG.27(B) SPUTTERING PRESSURE AND RESISTIVITY WHERE W (6N) IS FORMED AT 200°C (500°C 4hr ANNEAL)
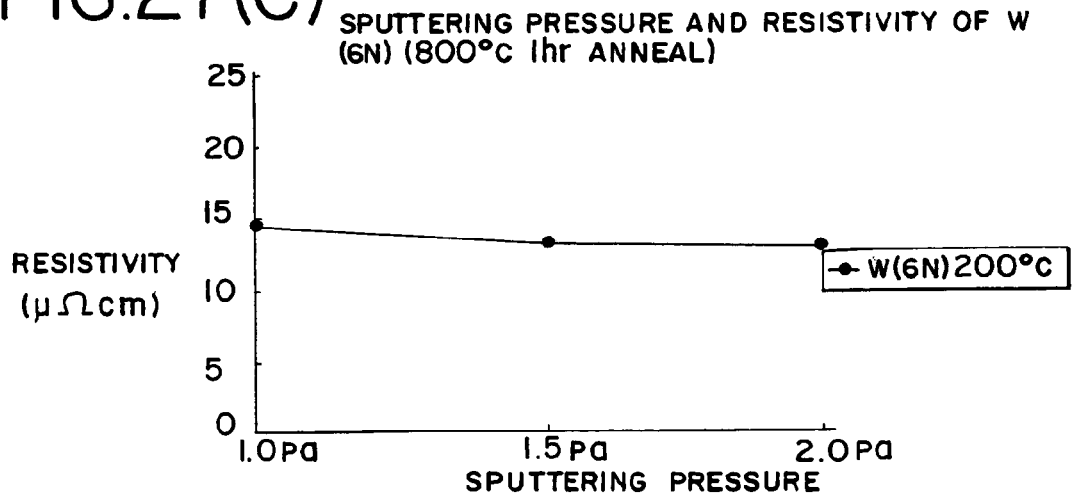
FIG.27(C) SPUTTERING PRESSURE AND RESISTIVITY OF W (6N) (800°C 1hr ANNEAL)

FIG. 28(A) TENSILE STRESS
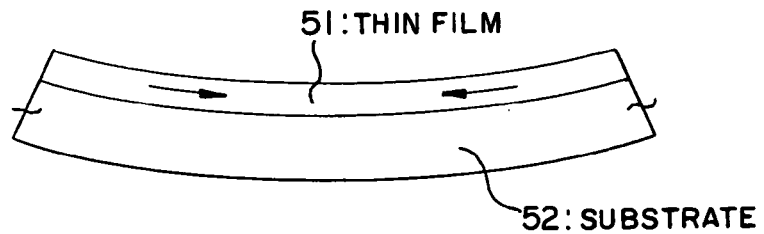
FIG. 28(B)
COMPRESSIVE STRESS
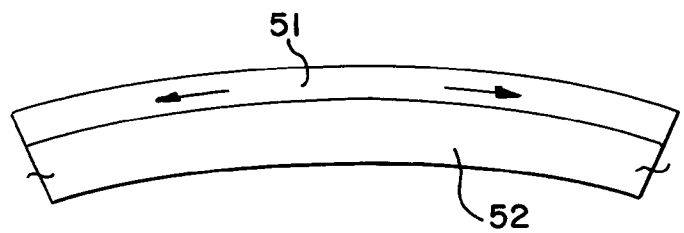
FIG. 29
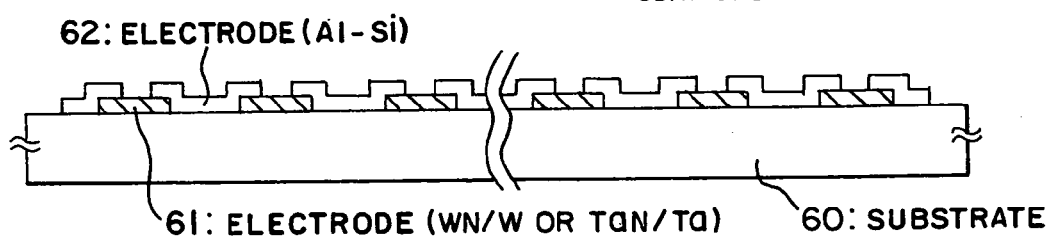

W FILM FORMING POWER AND STRESS

WIRING MATERIAL, SEMICONDUCTOR DEVICE PROVIDED WITH A WIRING USING THE WIRING MATERIAL AND METHOD OF MANUFACTURING THEREOF

This application is a division of U.S. application Ser. No. 09/604,997, filed on Nov. 21, 2000 now U.S. Pat. No. 6,661,096.

BACKGROUND OF THE INVENTION

The present invention relates to a wiring material of semiconductor devices. Specifically the present invention relates to a semiconductor device having a circuit comprising a thin film transistor (hereinafter referred to as TFT), and a manufacturing method thereof. For example, the present invention relates to an electro-optical device, which is represented by a liquid crystal display panel, and an electronic device with an electro-optical device loaded as a component.

In this specification, a semiconductor device indicates general devices that can function by using semiconductor characteristics, and that electro-optical devices, semiconductor circuits, and electronic devices are all categorized as semiconductor devices.

Recently, techniques for using semiconductor thin films (with a thickness of about several nm to several hundreds of nm) formed over a substrate having an insulating surface to constitute a thin film transistor (TFT) have been in the spotlight. Thin film transistors are widely applied to electronic devices such as ICs and electro-optical devices, and the development thereof as switching elements for image display devices is hastened.

Conventionally, aluminum films formed by sputtering and having low resistivity have been often used as the wiring material for the above stated TFTs. However, when a TFT is manufactured by using aluminum as a wiring material, operation error or deterioration of TFT characteristics were caused by formation of projections such as hillocks or whiskers or by diffusion of aluminum atoms into the channel forming region, in the heat treatment.

As stated above, aluminum is not a preferable wiring material in the TFT manufacturing process because of its low heat resistance.

Therefore, materials comprising, for example, tantalum (Ta) or titanium (Ti) as a main component are being tested for use as a wiring material other than aluminum. Tantalum and titanium have a high heat resistance in comparison to aluminum, but on the other hand there arises a problem of high electrical resistivity. Further, if tantalum is performed with heat treatment at a temperature of about 500 C, it becomes a problem that the electrical resistance increases by several times in comparison with that before heat treatment.

Furthermore, in the case that a film formed on a substrate possesses a large stress, substrate warping and film peeling generate, so it is preferable to perform film stress control and to form a film which possesses as low a stress as possible for a film formed by sputtering. As one means of controlling film stress, the use of a mixed gas of argon (Ar), krypton (Kr), xenon (Xe) as a sputtering gas has been proposed. However, since krypton (Kr) and xenon (Xe) are expensive, it is unsuitable for cases of mass production to use the mixed gas.

SUMMARY OF THE INVENTION

The present invention is accomplished in view of the above stated problems. The object of the present invention is to provide an electro-optical device having high reliability by using a material which has sufficiently low electrical resistivity, and sufficiently high heat resistance, as a wiring or as an electrode of respective circuits in the electro-optical device, typically an AM-LCD, and method of manufacturing thereof.

The structure of the present invention disclosed in this specification relates to a wiring material comprising tungsten or a tungsten compound as a main component, characterized in that argon is contained in an inert element within the wiring material at an amount of 90% or more, and the amount of sodium contained within the wiring material is 0.3 ppm or less.

In the above structure, the tungsten compound is a compound between a kind or a plural kinds of elements selected from the group consisting of Ta, Ti, Mo, Cr, Nb, and Si, and tungsten.

Further, the electrical resistivity of the wiring material in the above structure is 40 $\mu\Omega \cdot cm$ or less, preferably 20 $\mu\Omega \cdot cm$ or less.

Further, the structure of another invention relates to a semiconductor device having a wiring made from a metallic film containing a kind or a plural kinds of elements selected from the group consisting of W, Ta, Ti, Mo, Cr, Nb, and Si, a metallic compound film comprising said elements as main components; an alloy film of a combination of said elements; or a lamination film of thin films selected from the group consisting of said metallic film, said metallic compound film, and said alloy film, characterized in that the wiring includes argon in an inert element within the wiring at 90% or more, and the amount of sodium contained within the wiring is 0.3 ppm or less.

Furthermore, the structure of another invention relates to a semiconductor device provided with a wiring containing a film comprising tungsten or a tungsten compound as a main component, characterized in that the wiring includes argon in an inert element within the wiring at an amount of 90% or more, and the amount of sodium contained within the wiring is 0.3 ppm or less.

Still further, the structure of another invention relates to a semiconductor device provided with a wiring having a lamination structure containing a film comprising tungsten or a tungsten compound as a main component, and a nitride film of tungsten, characterized in that the wiring includes argon in an inert element within the wiring material at an amount of 90% or more, and the amount of sodium contained within the wiring material is 0.3 ppm or less.

In addition, the structure of another invention relates to a semiconductor device provided with a wiring having a lamination structure including a silicon film having an added impurity element for imparting conductivity, a film comprising tungsten or a tungsten compound as a main component, and a nitride film of tungsten, characterized in that the wiring includes argon in an inert element within the wiring at an amount of 90% or more, and the amount of sodium contained within the wiring is 0.3 ppm or less.

In each of the above structures, the wiring is characterized by being formed by sputtering using argon as a sputtering gas.

In each of the above structures, an inert element other than argon (Xe or Kr) is characterized by being contained within the wiring at an amount of 1 atoms % or less, preferably, 0.1 atoms % or less.

Furthermore, any one of the above respective structures is characterized in that the internal stress of the tungsten film or the film comprising the tungsten compound as its main component is from $-2 \times 10^{10}$ dyn/cm$^2$ to $2 \times 10^{10}$ dyn/cm$^2$, preferably, $-1 \times 10^{10}$ dyn/cm$^2$ to $1 \times 10^{10}$ dyn/cm$^2$.

In addition, any one of the above respective structures is characterized in that the line width of the wiring is 5 µm or less.

Further, any one of the above respective structures is characterized in that the film thickness of the wiring is 0.1 µm or more, and 0.7 µm or less.

Still further, any one of the above respective structures is characterized in that the wiring is used as a gate wiring of a TFT.

The structure of the present invention for realizing each of the above structures, relates to a method of manufacturing a semiconductor device comprising at least a wiring on an insulating surface, characterized in that the wiring is formed by steps of forming a tungsten film by a sputtering method and patterning the tungsten film.

In the above structure, the sputtering method is characterized in that a tungsten target having a purity of 4N or more is used.

In the above structure, the sputtering method is characterized by using a tungsten alloy target having a purity of 4N or more.

In the above structure, the sputtering method is characterized by using only argon as a sputtering gas.

Further, in each of the above structures, it is possible to obtain the desired value of film stress within the range of $-2 \times 10^{10}$ dyn/cm$^2$ to $2 \times 10^{10}$ dyn/cm$^2$, preferably, $-1 \times 10^{10}$ dyn/cm$^2$ to $1 \times 10^{10}$ dyn/cm$^2$ by properly controlling substrate temperature, gas pressure, and sputtering power.

Further, the sputtering method is characterized in that it is performed at a substrate temperature of 300 C or less and also, at a gas pressure from 0.1 Pa to 3.0 Pa, preferably, from 1.0 Pa to 2.0 Pa.

Still further, the sputtering method is characterized in that the sputtering power is 300 W to 15 KW, preferably, 1 KW to 9 KW (target having the size of φ305 mm), namely, in the sputtering power par unit area, 0.41 W/cm$^2$ to 20.53 W/cm$^2$, preferably, 1.37 W/cm$^2$ to 12.32 W/cm$^2$.

Note that, in this specification, as shown in FIG. 28, the term "internal" stress is referred to as a tensile stress and denoted by the symbol "+" as a stress in the direction of plus when a thin film 51 contracts with respect to a substrate 52, and the substrate 52 is pulled in a direction to prevent the contraction and the thin film 51 changes shape on the inside. On the other hand, when the thin film 51 expands, the substrate 52 is pushed shorter and the thin film 51 changes shape on the outside, and therefore this is referred to as compressive stress and denoted by the symbol "−" as a stress in the direction of minus.

Also in this specification, the term "electrode" refers to a portion of the "wiring", and denotes a location for performing electrical connection to another wiring, or a location intersection with a semiconductor layer. Therefore, for convenience of explanation, while the use of "wiring" and "electrode" is properly divided, "wiring" can be regarded as being included in "electrode".

BRIEF DESCRIPTION OF THE DRAWINGS

FIG. 1 are cross sectional views showing a process of manufacturing a pixel TFT, a storage capacitor, and a driving circuit TFT;

FIG. 2 are cross sectional views showing the process of manufacturing the pixel TFT, the storage capacitor, and the driving circuit TFT;

FIG. 3 are cross sectional views showing the process of manufacturing the pixel TFT, the storage capacitor, and the driving circuit TFT;

FIG. 4 are cross sectional views showing the process of manufacturing the pixel TFT, the storage capacitor, and the driving circuit TFT;

FIG. 24 are diagrams showing an example of electronic devices;

FIG. 26 are graphs showing the relationship between sputtering pressure and stress;

FIG. 27 are graphs showing the relationship between sputtering pressure and electrical resistivity;

FIG. 28 are views for explaining tensile stress and compressive stress;

FIG. 29 is a view showing a contact chain for determining contact resistance;

DETAILED DESCRIPTION OF THE PRESENTLY PREFERRED EMBODIMENTS

Figure 5:
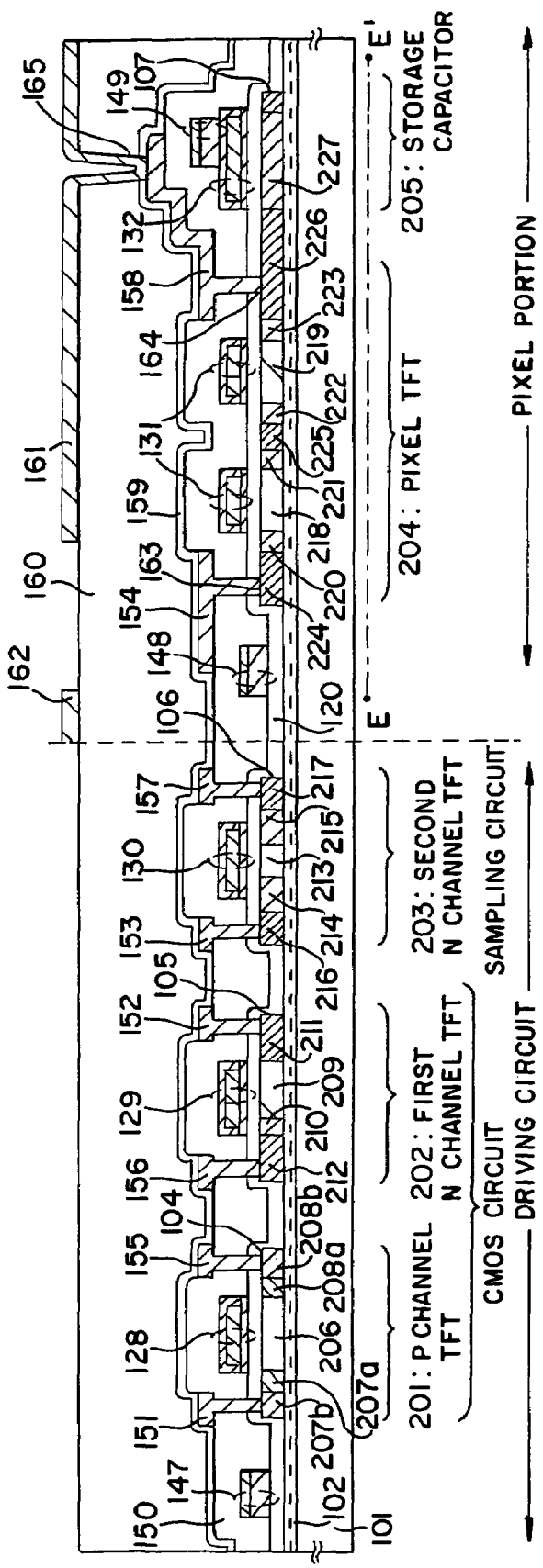
FIG. 5 is a cross sectional view of the pixel TFT, the storage capacitor, and the driving circuit TFT.

The embodiment modes of the present invention is explained below.

In order to solve the above stated problems, the present invention provides a high melting point metallic film obtained by sputtering using a target made from a high melting point metal having high purity. The typical use of tungsten (W) as the high melting point metal is one characteristic of the present invention.

A tungsten target having a high purity of 4N (99.99%) or more, preferably 6N (99.9999%) or more, is used as the target, and simple argon (Ar) gas is used as a sputtering gas.

Further, one characteristic of the present invention is that by regulating the substrate temperature and the sputtering gas pressure (gas pressure), stress control is performed. By setting the substrate temperature of 300 C or lower, and by setting the sputtering gas pressure from 1.0 Pa to 3.0 Pa, preferably between 1.0 Pa and 2.0 Pa, the film stress can be placed from $-5\times10^{10}$ dyn/cm$^2$ to $5\times10^{10}$ dyn/cm$^2$, preferably between $-2\times10^{10}$ dyn/cm$^2$ and $2\times10^{10}$ dyn/cm$^2$, more preferably between $-1\times10^{10}$ dyn/cm$^2$ and $1\times10^{10}$ dyn/cm$^2$.

Further, one characteristic of the present invention is that stress control is performed by regulating the substrate temperature, the sputtering gas pressure (gas pressure), or sputtering power.

Also, conventionally, if the sputtering power is made large, the film stress increases. However, by utilizing the present invention as stated above, the increase of film stress can be repressed and a large sputtering power can be introduced, thereby improving the sputtering rate.

The sodium (Na) concentration and the potassium (K) concentration of a tungsten film obtained in accordance with the above stated sputtering method was analyzed by a GDMS analysis method. The results of the analysis are shown in Table 1 and in FIG. 25.

TABLE 1

Result of Na and K analysis in W film

| DISCHARGE TIME (min.) | | | | | | | |
|---|---|---|---|---|---|---|---|
| | 1 | 4 | 6 | 9 | 11 | 14 | 16 |
| Na ppm | 0.08 | 0.02 | 0.01 | 0.02 | 0.01 | 0.01 | <0.01 |
| Si ppm | 1.7 | 1.2 | 1.4 | 1.2 | 1.2 | 0.9 | 0.7 |
| K ppm | <0.03 | <0.01 | <0.01 | <0.01 | <0.01 | <0.01 | <0.01 |

| DISCHARGE TIME (min.) | | | | | | |
|---|---|---|---|---|---|---|
| | 19 | 21 | 24 | 26 | 29 | 31 | 34 |
| Na ppm | 0.01 | 0.02 | 0.02 | 0.02 | 0.02 | 0.02 | 0.01 |
| Si ppm | 0.6 | 0.6 | 0.46 | 0.37 | 0.27 | 0.32 | 0.27 |
| K ppm | <0.01 | <0.01 | <0.01 | <0.01 | <0.01 | <0.01 | <0.01 |

| DISCHARGE TIME (min.) | | | | | | |
|---|---|---|---|---|---|---|
| | 36 | 39 | 41 | 44 | 46 | 49 |
| Na ppm | 0.02 | 0.02 | 0.02 | 0.02 | 0.02 | 0.02 |
| Si ppm | 0.2 | 0.19 | 0.16 | 0.17 | 0.19 | 12000 |
| K ppm | <0.01 | <0.01 | <0.01 | <0.01 | <0.01 | <0.01 |

*Values are RSF conversion concentration where W = 100%

Note that GDMS analysis is an abbreviation for the Glow Discharge Mass Spectrometry method in this specification, and is a solid state mass spectrometry method which sputters and ionizes a test piece by glow discharge. By obtaining a stable ion source, GDMS analysis is enjoying widespread use as a microanalysis method.

Figure 25:
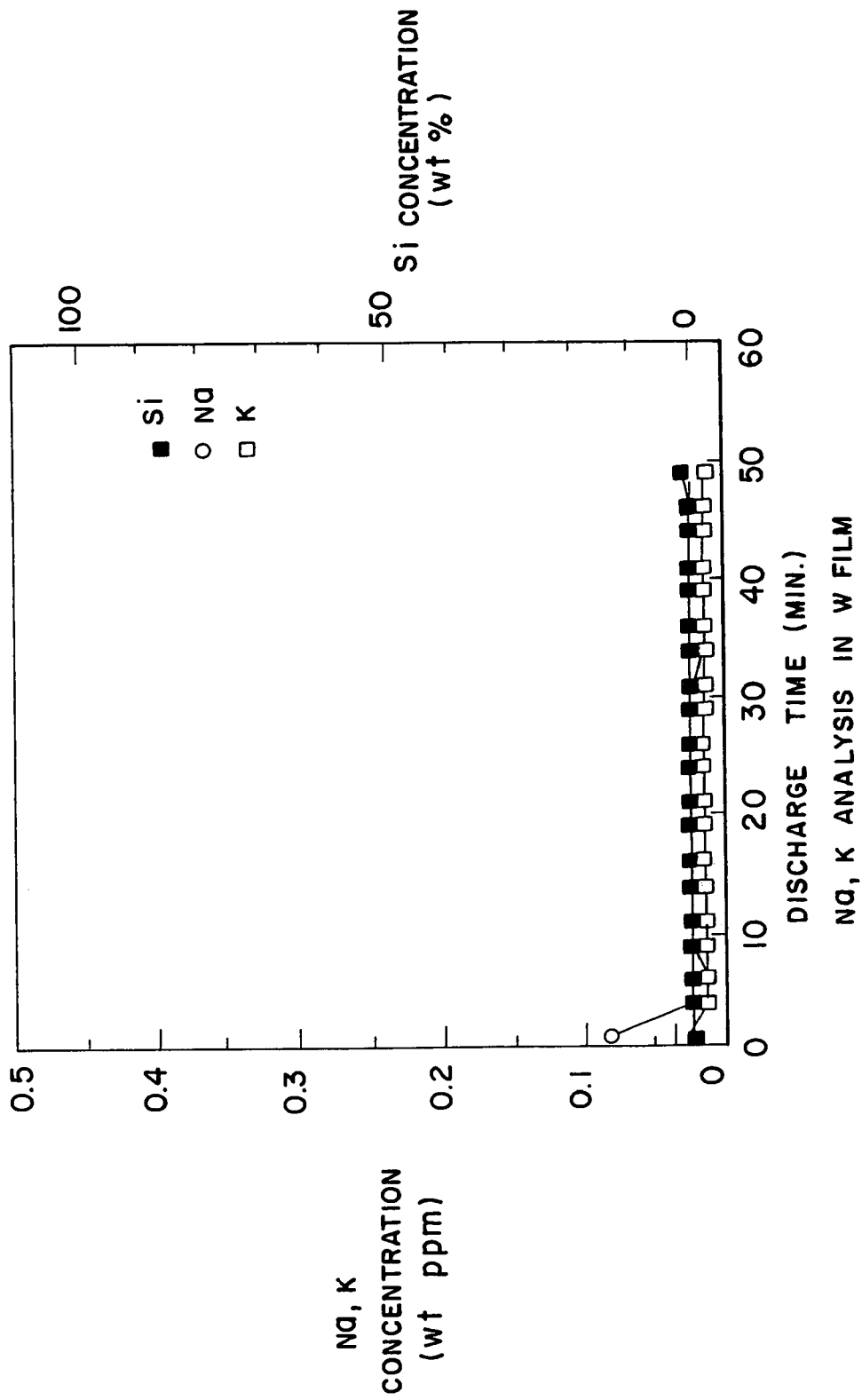
FIG. 25 is a graph showing the results of GDMS analysis.

As shown in Table 1 and in FIG. 25, the concentration of sodium (Na) in the tungsten film can be made of 0.3 ppm or less, preferably 0.1 ppm or less. If the film is used as a gate wiring, the sodium (Na) concentration can be kept within a range at which it does not impart any influence to the TFT characteristics. When a large concentration of sodium (Na) is contained within a gate electrode, there is a harmful influence imparted to the TFT characteristics.

Further, the wiring of a semiconductor device may be made into a lamination structure of the tungsten film and a nitrated tungsten film. For example, after depositing tungsten nitride (WN$_x$, where 0<x<1) on an insulating surface, tungsten (W) is laminated. In order to increase the adhesion, a structure in which a silicon film having conductivity (for example, a phosphorous-doped silicon film or a boron-doped silicon film) is formed on underlayer of the tungsten nitride (WN$_x$) may be used. Note that the wiring can be formed with a line width of 5 μm or less, and a film thickness from 0.1 to 0.7 μm.

The stress values for the tungsten film of the present invention are shown in FIG. 26(a), the stress values after heat treatment (for 4 hours at 500° C.) are shown in FIG. 26(b), and the stress values after heat treatment (for 4 hours at 800° C.) are shown in FIG. 26(c). The film deposition conditions for the tungsten film are as follows: an argon gas flow rate set to 100 sccm, and a sputtering power set to 6 kW. Note that in FIG. 26(b) and FIG. 26(c), a silicon oxide nitride film having a thickness of 200 nm (SiO$_x$N$_y$, where 0<x, and y<1) covers the tungsten film during heat treatment.

The tungsten film of the present invention is a film which has an initial tensile stress as the heat treatment temperature increases, but if heat treatment is performed, there is a tendency for the tensile stress to increase further, and therefore control of the film stress can be easily performed.

Note that the stress of the tungsten film of the present invention can be controlled by the substrate temperature, the pressure, and the sputtering power at the time of film deposition. Transition of the tungsten film stress after annealing differs from whether or not a silicon nitride oxide film is formed covering the tungsten film. Namely, when the tungsten film is covered by the silicon nitride oxide film, the stress changes in the tensile direction after annealing, and when the tungsten film is not covered by the silicon nitride oxide film, the stress changes in the compressive direction. If the condition for depositing the tungsten film are adjusted to give the tungsten film a weak compressive stress for cases in which it is covered by the silicon nitride oxide film, and to give the tungsten film a weak tensile stress for cases in which it is not covered by the silicon nitride oxide film, then it is possible to reduce the stress after annealing.

Figure 30:
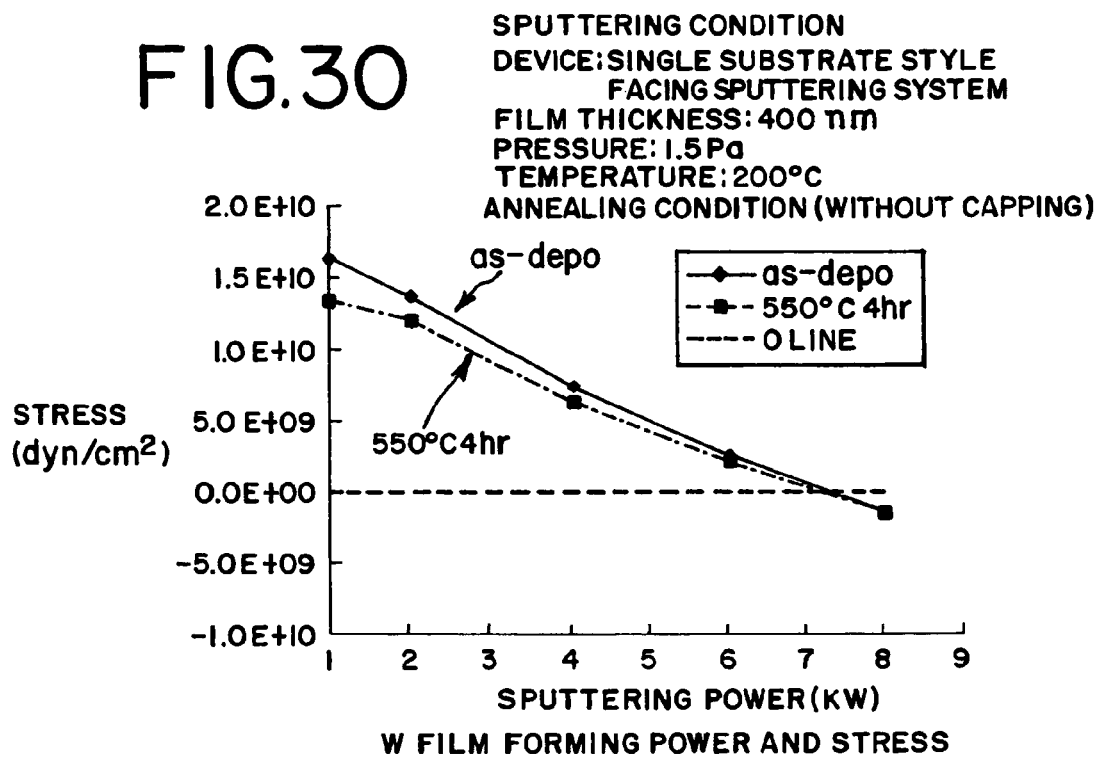
FIG. 30 is a graph showing the relationship between sputtering power and stress.
Figure 31:
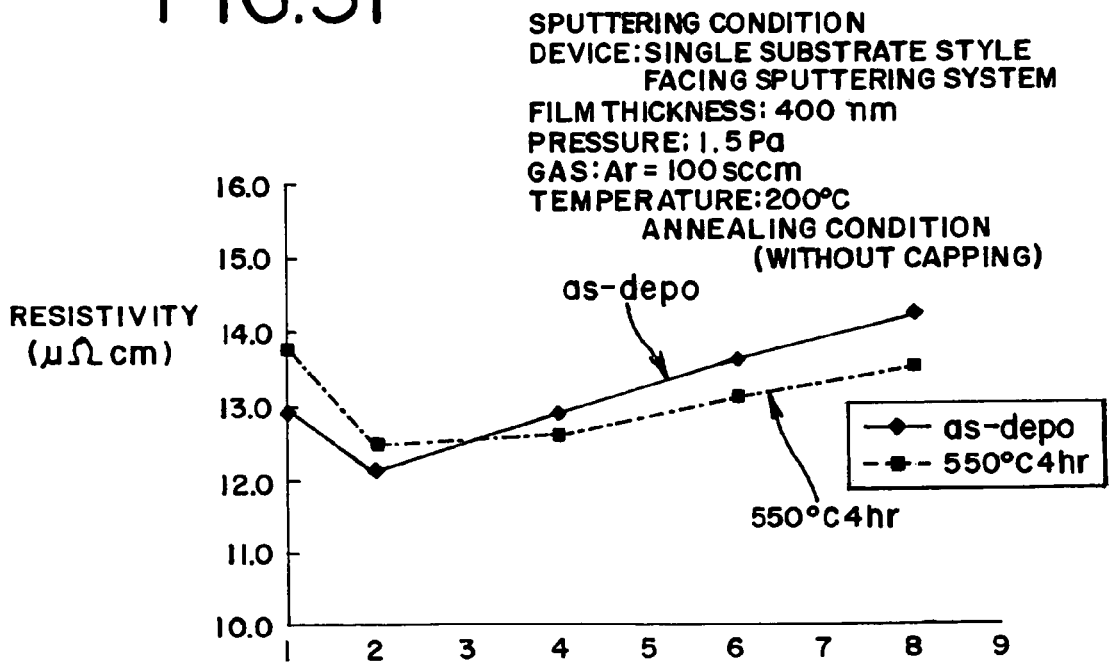
FIG. 31 is a graph showing the relationship between sputtering power and electrical resistivity.

Furthermore, FIG. 30 is a graph showing the relationship between sputtering power and stress. The stress of the tungsten film (having a film thickness of 400 nm) before and after heat treatment (for 4 hours at 550° C.) is shown in FIG. 30, respectively. It is thus possible to easily regulate the stress in accordance with the sputtering power. Also, as shown in FIG. 31, when the sputtering power is changed, the resistivity is also changed. FIG. 31 shows that the resistivity of the tungsten film before and after heat treatment (for 4 hours at 550° C.), respectively. The data of sputtering power shown in FIGS. 30 and 31 is obtained by using a target having the size of φ305 mm. Therefore, it is needless to say that the data can be converted to sputtering power par unit area.

Further, as a comparative example of general high melting point metal, FIG. 26(a) shows the pressure value of a lamination film of tantalum and tantalum nitride, FIG. 26(b) shows the pressure value after heat treatment (for 4 hours at 500° C.), FIG. 26(c) shows the pressure value after heat treatment (for 4 hours at 800° C.). In the same way, in FIG. 26(b) and FIG. 26(c), a silicon oxide nitride film having a thickness of 200 nm (SiO$_x$N$_y$, where 0<x, and y<1) covers the tungsten film during heat treatment.

As shown in FIG. 26(a) to FIG. 26(c), a lamination film of tantalum and tantalum nitride is a film which has an initial tensile stress as the heat treatment temperature increases, but if the heat treatment is performed, there is a tendency that the lamination film is transferred into the film having the compression pressure and therefore it is difficult to control the film stress.

Further, the resistivity of the tungsten film of the present invention is shown in FIG. 27(a), the resistivity after heat treatment (for 4 hours at 500° C.) is shown in FIG. 27(b), and the resistivity after heat treatment (for 4 hours at 800° C.) is shown in FIG. 27(c). Note that the resistivity here refers to the electrical resistivity.

As shown in FIGS. 27(a) to 27(c), the tungsten film of the present invention has a low resistivity (about 12 to 16 $\mu\Omega \cdot cm$), and almost no change in resistivity can be seen after heat treatment. Note that it is possible to make the resistivity of a tungsten film 12 $\mu\Omega \cdot cm$ or less, preferably around 9 $\mu\Omega \cdot cm$ by appropriately changing the sputtering conditions.

On the other hand, general high melting point metals do not have tolerance to oxidation, and is easily oxidized by heat treatment in an atmosphere in which several ppm of residual oxygen exists. As a result, the electrical resistivity increases and film peeling occurs. Further, the electrical resistivity also increases by impurity elements, such as a microscopic amount of oxygen contained in the reactive gas, being injected into the high melting point metallic film, during ion doping.

For example, although a lamination film of tantalum and tantalum nitride is covered by a 200 nm thick silicon nitride oxide film $SiO_xN_y$ (where 0<x, and y<1) when heat treatment is performed thereon, there is an increase in resistivity after heat treatment (about 50 to 80 $\mu\Omega \cdot cm$) by several times in comparison to that before heat treatment (about 25 $\mu\Omega \cdot cm$)

Furthermore, in the cases of forming a contact with another conducting film, an etching treatment is normally performed for removing a thin oxide film and contaminants before formation of the other conducting film. Next, the results of performing a comparison of resistance values, depending upon whether heat treatment is performed or not (for 1 hour at 500° C.), and whether etching (using 1/10 diluted HF) is performed or not before film deposition of an electrode 62 (Al—Si (2 wt %)), during formation of the structure shown in FIG. 29 on a substrate 60, are shown in Table 2.

TABLE 2

Contact resistance values with aluminum wiring

| Gate Material | Heat Treatment (500° C., 1 hr) | 1/10 HF Treatment | Resistance values $\Omega$ per contact area $\mu m$ square |
| --- | --- | --- | --- |
| W/WN | Yes | Yes | 1.3 |
| | Yes | No | 1.3 |
| | No | Yes | 1.2 |
| | No | No | 0.87 |
| Ta/TaN | Yes | Yes | 0.42k |
| | Yes | No | 0.42k |
| | No | Yes | 4.8 |
| | No | No | 19.7 |

Note that the number of contacts is set to 50, the total contact surface area is about 420 $\mu m^2$ and a comparison is performed between an electrode having a lamination structure of tantalum and tantalum nitride and an electrode having a lamination structure of the tungsten film and the tungsten nitride film. Note also that resistance values per 1 $\mu m$ square of contact surface area are shown in Table 2. The resistance value per 1 $\mu m$ square of contact surface area is referred to contact resistance values here.

The contact resistance between an electrode 61 having a lamination structure of tantalum and tantalum nitride and the electrode 62 (Al—Si (2 wt %)) is lower for the case when etching (using 1/10 diluted HF) is performed than for the case when etching is not performed. Further, when heat treatment is performed, a rapid increase is seen in the contact resistance of the wiring having the lamination structure of tantalum and tantalum nitride, and the value reaches 0.4 k$\Omega$.

On the other hand, there is no change seen in the contact resistance between the electrode 61 having a lamination structure of the tungsten film and the tungsten nitride film and the electrode 62 (Al—Si (2 wt %)) depending upon whether heat treatment or etching (using 1/10 diluted HF) is performed or not. The contact resistance value of this specification shows a sufficiently low resistance value of 1.3 $\Omega$. Provided that this resistance value of the contact is 40 $\Omega$ or less, preferably 10 $\Omega$ or less, more preferably 5 $\Omega$ or less, it is possible to use the tungsten film as a wiring. Furthermore, the film is not covered by the silicon nitride oxide film, similar to FIG. 2, when the heat treatment of Table 2 is performed.

In other words, there is almost no change in the resistivity of the tungsten film of the present invention when heat treatment is performed, even when not covered by a film such as the silicon nitride oxide film. It is thus understood that the tungsten film of the present invention has an extremely high resistance to heat, and that it is difficult to oxidize the film. Further, it is possible to omit etching for cases of using the tungsten film of the present invention.

By using the tungsten film, in which the amount of sodium contained within the film is 0.03 ppm or less, which has a low electrical resistivity (40 $\mu\Omega \cdot cm$ or less) even after heat treatment, and in which the stress is controlled to be from $-5\times10^{10}$ to $5\times10^{10}$ dyn/cm$^2$, preferably, $-1\times10^{10}$ to $1\times10^{10}$ dyn/cm$^2$ as the material for the gate wirings and other wirings of the TFT, the present invention can greatly increase the operating performance and the reliability of a semiconductor device provided with the TFT.

A more detailed explanation of the present invention having the above structure is performed as shown by the embodiments below.

Embodiment 1

Embodiments of the present invention will now be explained with reference to FIGS. 1 to 5. The method for simultaneously manufacturing pixel TFTs of the pixel portion and TFTs for driving circuit disposed in the peripheral of the pixel portion is described in details by following the process steps. In order to simplify the explanation, a CMOS circuit which is a base circuit for a shift register circuit, buffer circuit, etc., and an n-channel TFT that forms a sampling circuit are shown in the figures.

In FIG. 1(A), a low alkali glass substrate or a quartz substrate may be used as the substrate 101. A low alkali glass substrate was used in this embodiment. In this case, heat treatment may be performed beforehand at around temperature 10 to 20° C. lower than the glass strain point. A base film 102 comprising a silicon oxide film, a silicon nitride film or a silicon oxynitride film, etc. is formed to a thickness between 50 nm to 400 nm on the surface of the substrate 101 on which the TFT is formed, in order to prevent diffusion of the impurity from the substrate 101. For example, a lamination is formed, comprising a silicon oxynitride film formed by plasma CVD from $SiH_4$, $NH_3$ and $N_2O$ to a thickness of 100 nm and a silicon oxynitride film formed similarly from $SiH_4$ and $N_2O$ to a thickness of 200 nm.

Next, a semiconductor film 103a having an amorphous structure with a thickness of 20 to 150 nm (preferably 30 to 80 nm) is formed by a publicly known method such as plasma CVD or sputtering. In this embodiment, an amorphous silicon film was formed to a thickness of 55 nm by plasma CVD. Semiconductor films with amorphous structures include amorphous semiconductor films and microcrystalline semiconductor films, and a compound semiconductor film with an amorphous structure, such as an amorphous silicon-germanium film, may also be used. Since the base film 102 and the amorphous silicon film 103a can be formed by the same deposition method, they may be formed by continuous formation. The contamination on the surface can be prevented by keeping away from once exposing to the air atmosphere after forming the base film, and the fluctuation of the TFT properties and variation in the threshold voltage of the fabricated TFT can be reduced. (FIG. 1(A))

Then, a publicly known crystallization technique is used to form a crystalline silicon film 103b from the amorphous silicon film 103a. For example, laser crystallizing or heat crystallizing method (solid phase growth method) may be used, and here a crystalline silicon film 103b was formed by a crystallization method using a catalyst element, according to the technique disclosed in Japanese Patent Application Laid-Open No. Hei 7-130652. Though it depends on the amount of hydrogen contained in the amorphous silicon film, it is preferable to perform heat treatment at 400 to 500° C. for about one hour to reduce the hydrogen content to 5 atom % or less before crystallization process. Crystallization of the amorphous silicon film causes rearrangement of the atoms to a more dense form, so that the thickness of the crystalline silicon film that is fabricated is reduced by about 1 to 15% from the thickness of the original amorphous silicon film (55 nm in this embodiment). (FIG. 1(B))

The crystalline silicon film 103b is then divided into islands to form island semiconductor layers 104 to 107. A mask layer 108 is then formed from a silicon oxide film with a thickness of 50 to 100 nm by plasma CVD or sputtering. (FIG. 1(C))

A resist mask 109 was then provided, and boron (B) was added as an impurity element imparting p-type to a concentration of about $1 \times 10^{16}$ to $5 \times 10^{17}$ atoms/cm$^3$ over the entire surface of the island semiconductor layers 105 to 107 to form the n-channel TFTs, for the purpose of controlling the threshold voltage. The addition of boron (B) may be performed by ion doping, or it may be added simultaneously with deposition of the amorphous silicon film. While the addition of boron (B) is not necessarily essential, the semiconductor layers 110 to 112 were preferably formed with boron (B) added thereto to keep the threshold voltage of the n-channel TFT in the prescribed range. (FIG. 1(D))

An impurity element imparting n-type is selectively added to the island semiconductor layers 110 and 111 to form the LDD regions of the n-channel type TFT of the driving circuit. Resist masks 113 to 116 are formed beforehand for this purpose. Phosphorus (P) or arsenic (As) may be used as the impurity element imparting n-type, and here ion doping using phosphine ($PH_3$) was employed for addition of phosphorus (P). The phosphorus (P) concentration of the formed impurity regions 117 and 118 may be in the range of $2 \times 10^{16}$ to $5 \times 10^{19}$ atoms/cm$^3$. Throughout the present specification, the concentration of the impurity element imparting n-type into the impurity regions 117 to 119 formed here will be represented as (n$^-$). The impurity region 119 is a semiconductor layer for formation of the storage capacitor of the pixel portion, and phosphorus (P) was added in the same concentration in this region as well. (FIG. 2(A))

The mask layer 108 is next removed by hydrofluoric acid or the like, and the step for activating the impurity elements added in FIG. 1(D) and FIG. 2(A) is carried out. The activation can be performed by heat treatment for 1 to 4 hours at 500 to 600° C. in a nitrogen atmosphere, or by a laser activation method. These may also be carried out in combination. In this embodiment, a laser activation method was used, and the entire surface of the substrate on which the island semiconductor layers were formed was treated with KrF excimer laser light (248 nm wavelength) by scanning a beam formed into a linear shape, with oscillation frequency at 5 to 50 Hz and an energy density at 100 to 500 mJ/cm$^2$ and 80 to 98% linear beam overlap. There are no particular restrictions on the laser light irradiation conditions, and they may be appropriately set by the operator.

A gate insulating film 120 is then formed from an insulating film containing silicon at a thickness of 10 to 150 nm by using plasma CVD or sputtering. For example, a silicon oxynitride film is formed to a thickness of 120 nm. The gate insulating film may also be a single layer or lamination structure of other insulating films containing silicon. (FIG. 2(B))

A first conductive layer is then fabricated to form the gate electrodes. This first conductive layer may be formed as a single layer, but if necessary it may also have a laminated structure of two or three layers. In this embodiment, a conductive layer (A) 121 comprising a conductive metal nitride film and a conductive layer (B) 122 comprising a metallic film were laminated. The conductive layer (B) 122 may be formed of an element selected from among tantalum (Ta), titanium (Ti), molybdenum (Mo) and tungsten (W), or an alloy composed mainly of one of these elements, or an alloy film comprising a combination of these elements (typically a Mo—W alloy film or Mo—Ta alloy film), and the conductive layer (A) 121 is formed of tantalum nitride (TaN), tungsten nitride (WN), titanium nitride (TiN) or molybdenum nitride (MoN). As alternative materials for the conductive layer (A) 121 there may be used tungsten silicide, titanium silicide or molybdenum silicide. The conductive layer (B) may have a reduced impurity concentration for the purpose of lower resistance, and in particular the sodium concentration was satisfactory at 0.1 ppm or lower, and oxygen concentration was satisfactory at under 1 wt % or lower. For example, tungsten (W) with an oxygen concentration of under 0.2 wt % allowed realization of a resistivity of 40 μΩ·cm or less, or more preferably 20 μΩ·cm or less.

The conductive layer (A) 121 may be 10 to 50 nm (preferably 20 to 30 nm) and the conductive layer (B) 122 may be 200 to 400 nm (preferably 250 to 350 nm). In this embodiment, a tungsten nitride ($WN_x$) film with a thickness of 50 nm was used as the conductive layer (A) 121 and a tungsten (W) film of 350 nm was used as the conductive layer (B) 122, and both were formed continuously by sputtering without exposing to the atmosphere.

In this embodiment, tungsten target of 6N (99.9999%) was used, and a simple substance gas of argon (Ar) was used as the sputtering gas. Further, the stress of the film was controlled within a range of from $-5 \times 10^{10}$ to $5 \times 10^{10}$ dyn/cm$^2$, preferably $-2 \times 10^{10}$ to $2 \times 10^{10}$ dyn/cm$^2$, more preferably $-1 \times 10^{10}$ to $1 \times 10^{10}$ dyn/cm$^2$ by setting the substrate temperature at 200° C., the pressure of the sputtering gas at 1.5 Pa, sputtering power of 6 kW. Accordingly sodium (Na)

concentration in the tungsten film of the present invention can be made 0.3 ppm or lower, preferably 0.1 ppm or lower at GDMS (glow discharge mass spectrometry) analysis, so that it can be made within a range of not affecting the TFT characteristics in the case of using as a gate wiring. Further, change in the resistivity was not found in the tungsten film of the present invention even after performing heat treatment. Therefore the operating performance and reliability of the TFTs can be greatly improved by using gate wiring having low resistivity and high reliability.

Though not shown, it is effective to form a silicon film doped with phosphorus (P) to a thickness of about 2 to 20 nm under the conductive layer (A) 121. This can improve adhesion and prevent oxidation of the conductive film formed thereover, while also preventing diffusion of trace alkali metal elements in the conductive layer (A) or conductive layer (B) into the gate insulating film 120. (FIG. 2(C))

Resist masks 123 to 127 are then formed, and the conductive layer (A) 121 and conductive layer (B) 122 are etched together to form gate electrodes 128 to 131 and a capacity wiring 132. The gate electrodes 128 to 131 and capacity wiring 132 comprise the integrally formed 128a to 132a comprising the conductive layer (A) and 128b to 132b comprising the conductive layer (B). Here, the gate electrodes 129 and 130 formed in the driving circuit are formed so as to overlap with a portion of the impurity regions 117 and 118 via the gate insulating film 120. (FIG. 2(D))

This is followed by a step of adding an impurity element imparting p-type to form a source region and a drain region of the p-channel TFT of the driving circuit. Here, the gate electrode 128 is used as a mask to form impurity regions in a self-aligned manner. The region in which the n-channel TFT is formed is covered at this time with a resist mask 133. The impurity regions 134 are formed by ion doping method using diborane ($B_2H_6$). The boron (B) concentration of this region is $3\times10^{20}$ to $3\times10^{21}$ atoms/cm$^3$. In this specification, the concentration of the impurity element imparting p-type in the impurity regions 134 formed here will be represented as ($p^+$). (FIG. 3(A))

Next, impurity regions functioning as a source region or a drain region were formed in the n-channel TFT. Resist masks 135 to 137 were formed, and an impurity element imparting n-type was added to form impurity regions 138 to 142. This was accomplished by an ion doping method using phosphine ($PH_3$), and the phosphorus (P) concentration in the regions was in the range of $1\times10^{20}$ to $1\times10^{21}$ atoms/cm$^3$. In the present specification, the concentration of the impurity element imparting n-type in the impurity regions 138 to 142 formed here will be represented as ($n^+$). (FIG. 3(B))

The impurity regions 138 to 142 already contain phosphorus (P) or boron (B) added in the foregoing steps, but since a sufficiently high concentration of phosphorus (P) is added in comparison, the influence of the phosphorus (P) or boron (B) added in the foregoing steps need not be considered. As the concentration of phosphorus (P) added to the impurity region 138 is ½ to ⅓ of the boron (B) concentration added in FIG. 3(A), the p-type conductivity is guaranteed so that there is no effect on the properties of the TFT.

This was followed by a step of adding an impurity element imparting n-type to form an LDD region in the n-channel TFT of the pixel portion. Here, the gate electrode 131 was used as a mask for self-aligning addition of an impurity element imparting n-type by ion doping. The concentration of phosphorus (P) added was $1\times10^{16}$ to $5\times10^{18}$ atoms/cm$^3$, and by adding a lower concentration than the concentrations of the impurity elements added in FIG. 2(A), FIG. 3(A) and FIG. 3(B), only impurity regions 143 and 144 are substantially formed. In this specification, the concentration of the impurity element imparting n-type in these impurity regions 143 and 144 will be represented as ($n^-$) (FIG. 3(C)).

This was followed by a step of heat treatment for activation of impurity element imparting the n-type or p-type added at their respective concentrations. This step can be accomplished by furnace annealing, laser annealing or rapid thermal annealing (RTA). Here, the activation step was performed by furnace annealing. The heat treatment is carried out in a nitrogen atmosphere with an oxygen concentration of 8 ppm to 9%, at 400 to 800° C. and typically 500 to 600° C., and for this embodiment the heat treatment was carried out at 550° C. for 4 hours. When a material having heat resistance such as a quartz substrate is used for the substrate 101, the heat treatment may even be at 800° C. for one hour, and this allowed activation of the impurity element and formation of a satisfactory bond between an impurity regions added with the impurity element and a channel forming region.

In the heat treatment, conductive layers (C) 128c to 132c are formed to a thickness of 5 to 80 nm from the surfaces of the metallic films 128b to 132b forming the gate electrodes 128 to 131 and the capacity wiring 132. For example, when the conductive layers (B) 128b to 132b are of tungsten (W), tungsten nitride (WN) is formed, whereas when tantalum (Ta) is used, tantalum nitride (TaN) may be formed. The conductive layers (C) 128c to 132c may be formed in the same manner by exposing the gate electrodes 128 to 131 to a plasma atmosphere that contains nitrogen or nitrogen using ammonia or the like. A step for hydrogenation of the island semiconductor layers is then performed by heat treatment at 300 to 450° C. for 1 to 12 hours in an atmosphere containing 3 to 100% hydrogen. This step is a step for terminating the dangling bond of the semiconductor layer by thermally excited hydrogen. Plasma hydrogenation (using plasma-excited hydrogen) may also be carried out as another means for hydrogenation.

When the island semiconductor layer was fabricated by a method of crystallization using a catalyst element from an amorphous silicon film, a vary small amount of the catalyst element is remained in the island semiconductor layers. While it is of course possible to complete the TFT even in this condition, it is more preferable for the residual catalyst element to be eliminated at least from the channel forming regions. One means used to eliminate the catalyst element was utilizing the gettering effect by phosphorus (P). The phosphorus (P) concentration necessary for gettering is on the same level as the impurity region ($n^+$) formed in FIG. 3(B), and the heat treatment for the activation step carried out here allowed gettering of the catalyst element from the channel forming region of the n-channel TFT and p-channel TFT. (FIG. 3(D))

Figure 6A:
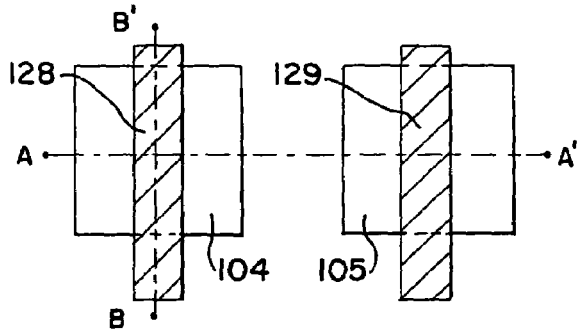
FIG. 6 are top views showing a process of manufacturing a pixel TFT, a storage capacitor, and a driving circuit TFT.
Figure 6B:
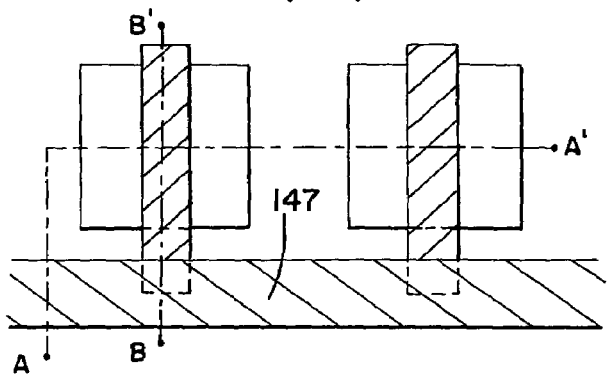
Figure 6C:
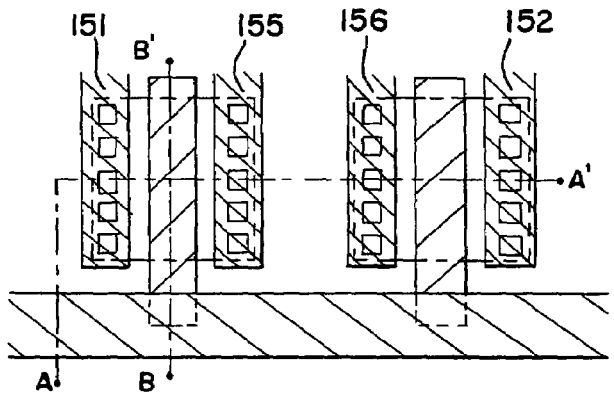
Figure 7A:
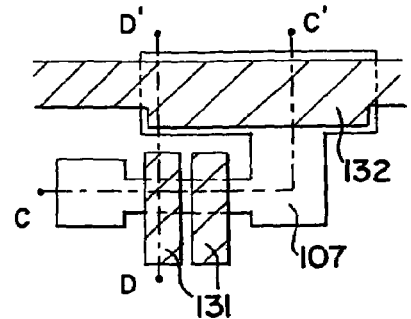
FIG. 7 are top views showing the process of manufacturing the pixel TFT, the storage capacitor, and the driving circuit TFT.
Figure 8A:
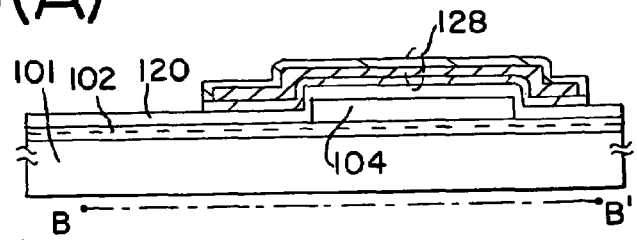
FIG. 8 are top views showing the process of manufacturing the driving circuit TFT.
Figure 9A:
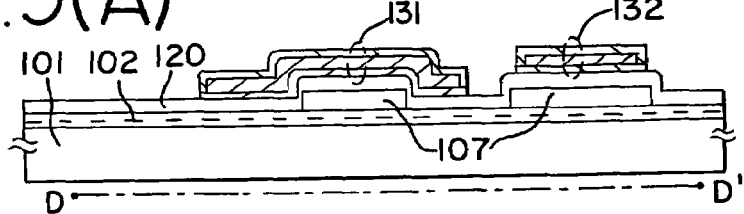
FIG. 9 are top views showing the process of manufacturing the pixel TFT.

FIG. 6(A) and FIG. 7(A) are top views of a TFT up to this step, where cross-section A-A' and cross-section C-C' correspond to A-A' and C-C' in FIG. 3(D). Cross-section B-B' and cross-section D-D' correspond to the cross-sectional views of FIG. 8(A) and FIG. 9(A). The top views of FIG. 6 and FIG. 7 omit the gate insulating films, but up to this step, at least the gate electrodes 128 to 131 and capacity wiring 132 are formed over the island semiconductor layers 104 to 107, as shown in the drawings.

After completion of the steps of activation and hydrogenation, the second conductive film to serve as the gate wiring is formed. This second conductive film may be formed with a conductive layer (D) comprising mainly of aluminum (A), copper (Cu), silver (Ag) having low resistance materials or an alloy (Ag—Pd—Cu), and a conductive layer (E) comprising titanium (Ti), tantalum (Ta), tungsten (W) or molybdenum (W). In this embodiment, the conductive layer (D) 145 was an aluminum (Al) film containing 0.1 to 2 wt % titanium (Ti), and the conductive layer (E) 146 was a titanium (Ti) film. The conductive layer (D) 145 may be formed to 200 to 400 nm (preferably 250 to 350 nm), and the conductive layer (E) 146 may be formed to 50 to 200 nm (preferably 100 to 150 nm). (FIG. 4(A))

The conductive layer (E) 146 and conductive layer (D) 145 were subjected to etching treatment, thus forming gate wirings 147 and 148 and capacity wiring 149 so that the gate wiring that are connected to the gate electrodes are formed. The etching treatment first is accomplished removal from the surface of the conductive layer (E) to partway through the conductive layer (D) by a dry etching method using a mixed gas of $SiCl_4$, $Cl_2$ and $BCl_3$, and then wet etching was performed with a phosphoric acid-based etching solution to remove the conductive layer (D), thus allowing formation of a gate wiring while maintaining selectivity to the base film.

Figure 7B:
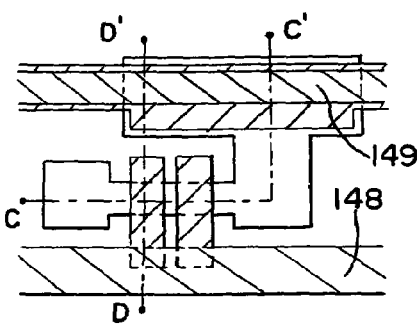
Figure 8B:
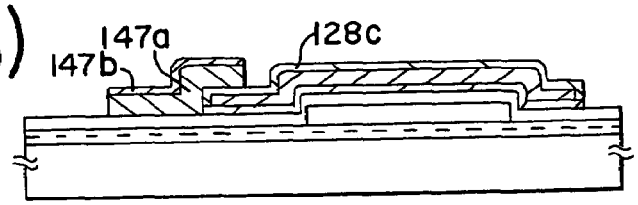
Figure 9B:
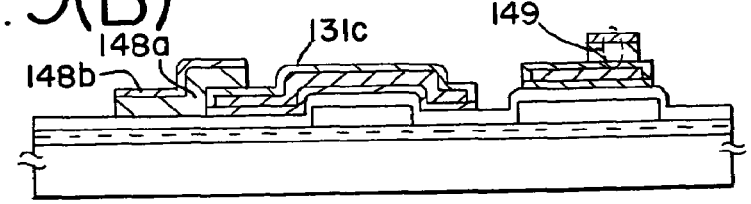

FIG. 6(B) and FIG. 7(B) are top views of this state, where cross-section A-A' and cross-section C-C' correspond to A-A' and C-C' in FIG. 4(B). Cross-section B-B' and cross-section D-D' correspond to the B-B' and D-D' in FIG. 8(B) and FIG. 9(B). In FIG. 6(B) and FIG. 7(B), part of the gate wirings 147 and 148 overlap and are in electrical contact with part of the gate electrodes 128, 129 and 131. This condition is clearly shown in the cross-sectional diagrams of FIG. 8(B) and FIG. 9(B) corresponding to cross-section B-B' and cross-section D-D', where conductive layer (C) forming the first conductive layer and conductive layer (D) forming the second conductive layer are in electrical contact.

A first interlayer insulating film 150 is formed with a silicon oxide film or silicon oxynitride film to a thickness of 500 to 1500 nm, after which contact holes are formed reaching to the source region or drain region formed in each island semiconductor layer, to form source wirings 151 to 154 and drain wirings 155 to 158. While not shown here, in this embodiment the electrode has a 3-layer laminated structure formed by continuous formation of a Ti film to 100 nm, a Ti-containing aluminum film to 300 nm and a Ti film to 150 nm by sputtering.

Next, a silicon nitride film, silicon oxide film or a silicon oxynitride film is formed to a thickness of 50 to 500 nm (typically 100 to 300 nm) as a passivation film 159. Hydrogenation treatment in this state gave favorable results for enhancement of the TFT characteristics. For example, heat treatment may be carried out for 1 to 12 hours at 300 to 450° C. in an atmosphere containing 3 to 100% hydrogen or in an atmosphere containing nitrogen, or a similar effect may be achieved by using a plasma hydrogenation method. Here, an opening may be formed in the passivation film 159 at the position where the contact holes are to be formed for connection of the pixel electrodes and the drain wirings (FIG. 4(C)).

Figure 7C:
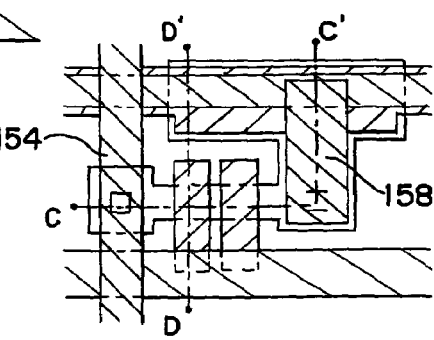
Figure 8C:
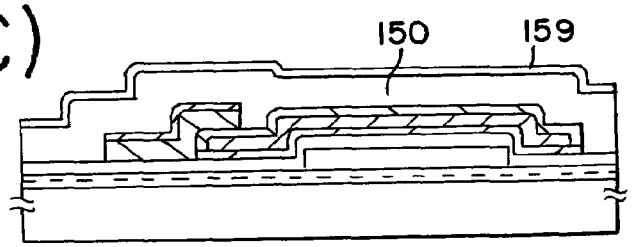
Figure 9C:
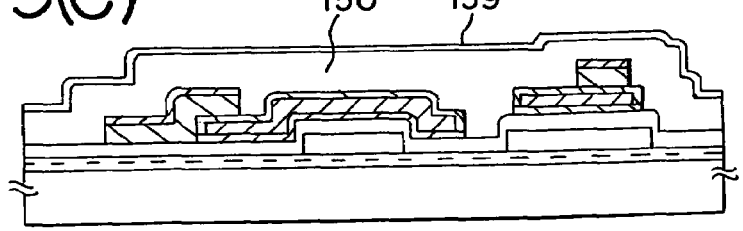

FIG. 6(C) and FIG. 7(C) show top views of this condition, where cross-section A-A' and cross-section C-C' correspond to A-A' and C-C' in FIG. 4(C). Cross-section B-B' and cross-section D-D' correspond to B-B' and D-D' in FIG. 8(C) and FIG. 9(C). FIG. 6(C) and FIG. 7(C) do not show the first interlayer insulating film, but the source wirings 151, 152, 154 and drain wirings 155, 156, 158 in the source and drain regions (not shown) of the island semiconductor layers 104, 105, 107 are connected via contact holes formed in the first interlayer insulating film.

Thereafter, a second interlayer insulating film 160 made of an organic resin is formed to a thickness of 1.0 to 1.5 μm. As the organic resin, polyimide, acrylic, polyamide, polyimideamide, BCB (benzocyclobutene) or the like can be used. Here, polyimide which is a type of thermal polymerization after applying onto the substrate was used and fired at 300° C. A contact hole reaching to the drain wiring 158 is then formed in the second interlayer insulating film 160, and pixel electrodes 161 and 162 are formed. The pixel electrodes used may be of a transparent conductive film in the case of a transmission type liquid crystal display device, or of a metal film in the case of a reflection type liquid crystal display device. In this embodiment a transmission type liquid crystal display device was used, and therefore an indium-tin oxide (ITO) film was formed by sputtering to a thickness of 100 nm. (FIG. 5)

A substrate comprising a driving circuit TFT and a pixel TFT of the pixel portion on the same substrate was completed in this manner. A p-channel TFT 201, a first n-channel TFT 202 and a second n-channel TFT 203 were formed on the driving circuit and a pixel TFT 204 and a storage capacitor 205 were formed in the pixel portion. Throughout the present specification, this substrate will be referred to as an active matrix substrate for convenience.

The p-channel TFT 201 of the driving circuit has a channel forming region 206, source regions 207a, 207b and drain regions 208a, 208b in the island semiconductor layer 104. The first n-channel TFT 202 has a channel forming region 209, a LDD region 210 overlapping the gate electrode 129 (hereunder this type of LDD region will be referred to as $L_{ov}$), a source region 211 and a drain region 212 in the island semiconductor layer 105. The length of this $L_{ov}$ region in the channel length direction was 0.5 to 3.0 μm, and is preferably 1.0 to 1.5 μm. The second n-channel TFT 203 has a channel forming region 213, LDD regions 214, 215, a source region 216 and a drain region 217 in the island semiconductor layer 106. These LDD regions are formed of an $L_{ov}$ region and a LDD region not overlapping the gate electrode 130 (hereunder this type of LDD region will be referred to as $L_{off}$), and the length of this $L_{off}$ region in the channel length direction is 0.3 to 2.0 μm, and preferably 0.5 to 1.5 μm. The pixel TFT 204 has channel forming regions 218, 219, $L_{off}$ regions 220 to 223 and source or drain regions 224 to 226 in the island semiconductor layer 107. The length of the $L_{off}$ regions in the channel length direction is 0.5 to 3.0 μm, and preferably 1.5 to 2.5 μm. A storage capacitor 205 is formed from: the capacity wirings 132 and 149; an insulating film made of the same material as the gate insulating film; and a semiconductor layer 227 added with an impurity element imparting n-type and connected to the drain region 226 of the pixel TFT 204. In FIG. 5 the pixel TFT 204 has a double gate structure, but it may also have a single gate structure, and there is no problem with a multigate structure provided with a plurality of gate electrodes.

Thus, the present invention optimizes the structures of the TFTs of each circuit in accordance with the specifications required for the pixel TFT and driving circuit, thus allowing the operating performance and reliability of the semiconductor device to be improved. In addition, by forming the gate electrodes with a heat resistant conductive material, it is possible to facilitate activation of the LDD regions and source and drain regions, and thus adequately reduce wiring resistance by formation of the gate wirings with low resistance materials. Accordingly application to display devices having pixel portion (display size) in the class of 4 inches and larger is possible.

Embodiment 2

FIG. 16 shows an example of other embodiments of gate electrodes and gate wirings. The gate electrodes and gate wirings in FIG. 16 are formed in the same manner as the steps indicated for Embodiment 1, and are formed over the island semiconductor layer 901 and gate insulating film 902.

Figure 16A:
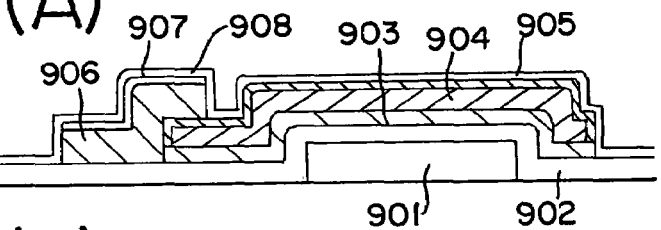
FIG. 16 are views showing the connection between the gate electrode and a gate wiring.

In FIG. 16(A), the first conductive layer as the gate electrode is a conductive layer (A) 903 formed of tantalum nitride (TaN), tungsten nitride (WN), titanium nitride (TiN) or molybdenum nitride (MoN). The conductive layer (B) 904 is formed of an element selected from among tantalum (Ta), titanium (Ti), molybdenum (Mo) and tungsten (W), or an alloy composed mainly of the above stated element or an alloy film comprising a combination of those elements, while a conductive layer (C) 905 is formed on the surface in the same manner as Embodiment 1. The conductive layer (A) 903 may be 10 to 50 nm (preferably 20 to 30 nm) and the conductive layer (B) 904 may be 200 to 400 nm (preferably 250 to 350 nm). The second conductive layer that will form the gate electrode is formed by laminating conductive layer (D) comprising mainly of aluminum (Al) or copper (Cu) having a low resistance material and conductive layer (E) thereover formed of titanium (Ti) or tantalum (Ta). Because aluminum (Al) and copper (Cu) diffuse readily by stress migration or electromigration, the silicon nitride film 908 must be formed to a thickness of 50 to 150 nm so as to cover the second conductive layer.

Figure 16B:
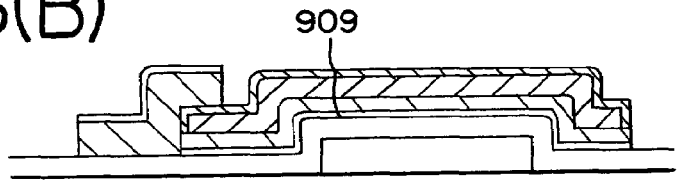

FIG. 16(B) shows a gate electrode and gate wiring fabricated in the same manner as Embodiment 1, and a silicon film 909 doped with phosphorus (P) is formed under the gate electrode. The silicon film 909 doped with phosphorus (P) has the effect of preventing diffusion of a vary small amount of alkali metal element in the gate electrode into the gate insulating film, and is useful for the purpose of guaranteeing the reliability of the TFT.

Figure 16C:
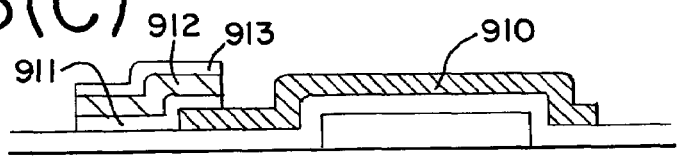

FIG. 16(C) is an example of formation on the first conductive layer that will form the gate electrode, with a silicon film 910 doped with phosphorus (P). The silicon film doped with phosphorus (P) is a higher resistance material than the other conductive metal material, but by forming the second conductive layer that forms the gate wiring from aluminum (Al), copper (Cu) or silver (Ag), it may be applied to large-area liquid crystal display devices. Here, the gate wiring may be made with a three-layer structure with formation of a Ti film (911) to 100 nm, a Ti-containing aluminum (Al) film (912) to 300 nm and a Ti film (913) to 150 nm, avoiding direct contact between the aluminum (Al) film and the phosphorus (P)-doped silicon film to provide heat resistance.

Embodiment 3

FIG. 15 is an illustration to explain the structure of a TFT according to the invention, showing the positional relationship between the gate electrode and LDD region in a TFT comprising: a semiconductor layer having channel forming region and an LDD region; a gate insulating film over the semiconductor layer; and a gate electrode over the gate insulating film.

Figure 15A:
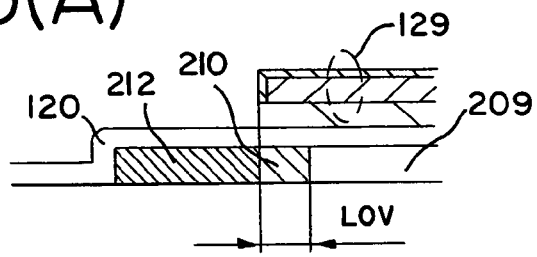
FIG. 15 are views showing the positional relationship between a gate electrode and an LDD region.

FIG. 15(A) shows a structure provided with a semiconductor layer having a channel forming region 209, LDD region 210 and drain region 212, a gate insulating film 120 and gate electrode 129 formed thereover. The LDD region 210 is an $L_{ov}$ provided overlapping the gate electrode 129 via the gate insulating film 120. The $L_{ov}$ has the function of attenuating the high electric field generated near the drain while preventing deterioration by hot carriers, and it can be suitably used in an n-channel TFT of a shift register circuit, a level shifter circuit, a buffer circuit or the like of the control circuit.

Figure 15B:
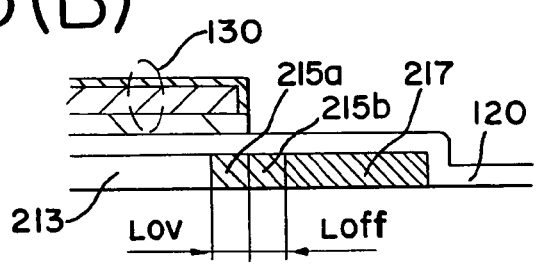

FIG. 15(B) shows a structure provided with a semiconductor layer having a channel forming region 213, LDD regions 215a, 215b and a drain region 217, a gate insulating film 120 and gate electrode 130 formed on the semiconductor layer. The LDD region 215a is provided overlapping the gate electrode 130 via the gate insulating film 120. Also, the LDD region 215b is an $L_{off}$ provided without overlapping the gate electrode 130. The $L_{off}$ has the function of reducing the off-current value, and the structure provided with the $L_{ov}$ and $L_{off}$ can prevent deterioration by hot carriers while also reducing the off-current value, so that it may be suitably used in an n-channel TFT of the sampling circuit of a control circuit.

Figure 15C:
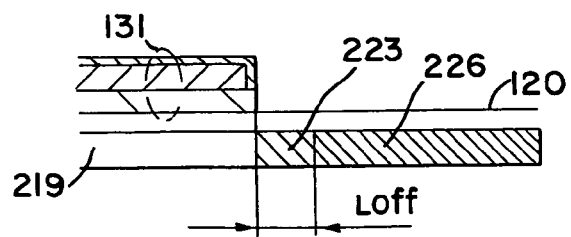

FIG. 15(C) shows a semiconductor layer provided with a channel forming region 219, an LDD region 223 and a drain region 226. The LDD region 223 is an $L_{off}$ provided without overlapping the gate electrode 131, and it can effectively reduce the off-current value and is therefore suitable for use in a pixel TFT. The concentration of the n-type impurity element in the LDD region 223 of the pixel TFT is preferably from ½ to ¹⁄₁₀ less than the concentration in the LDD regions 210 and 215 of the driving circuit.

Embodiment 4

Figure 11:
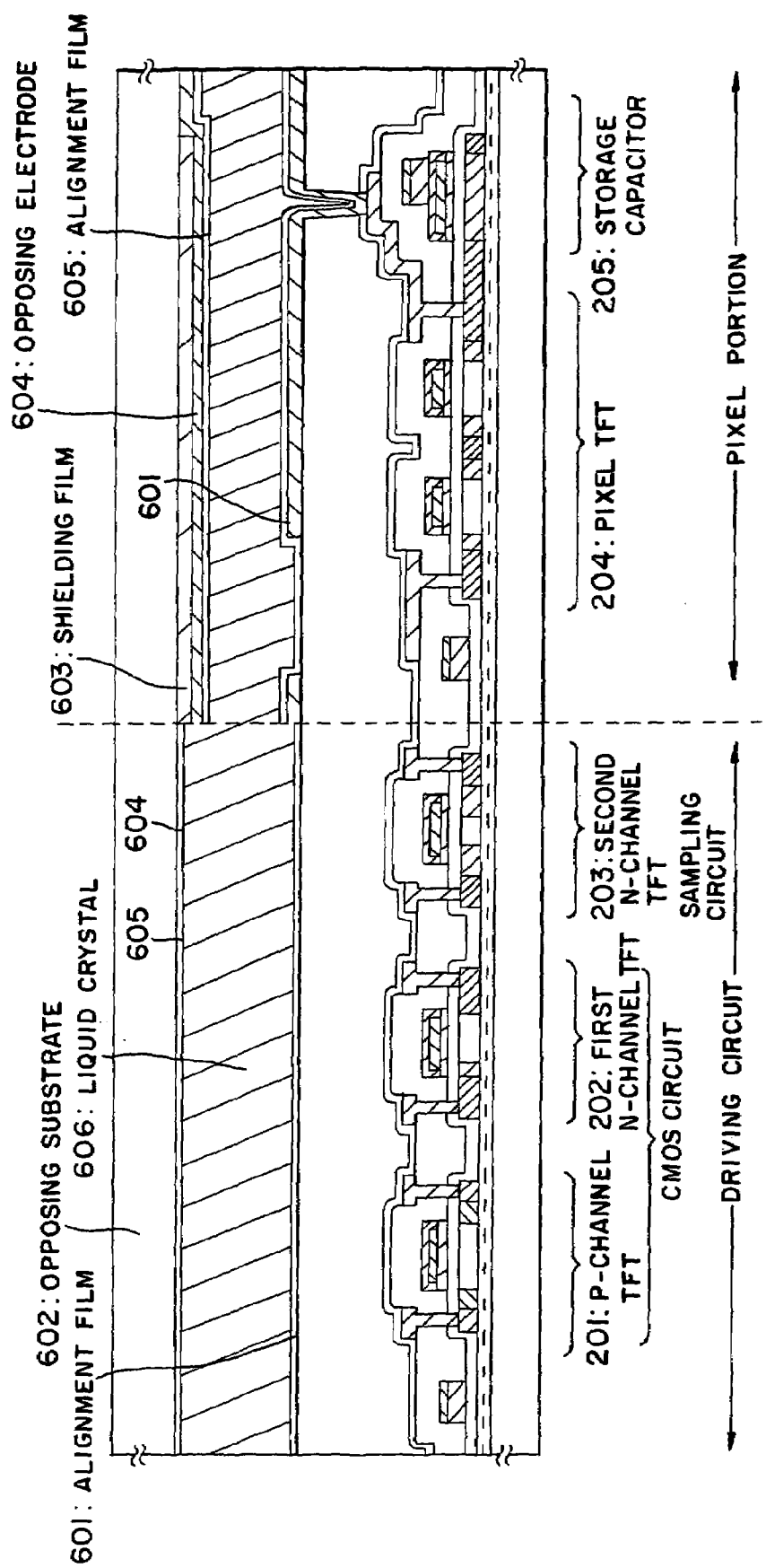
FIG. 11 is a cross sectional drawing showing the structure of the liquid crystal display device.

In this embodiment, the steps for fabricating an active matrix liquid crystal display device from an active matrix substrate will be explained. As shown in FIG. 11, an alignment film 601 is formed on an active matrix substrate in the state shown in FIG. 5 fabricated in Embodiment 1. In general, a polyimide resin is often used as the alignment film for liquid crystal display elements. On the opposing substrate 602 on the opposite side there are formed a shielding film 603, a transparent conductive film 604 and an alignment film 605. After forming the alignment film, it is subjected to rubbing treatment so that the liquid crystal molecules are oriented with a consistent pretilt angle. The active matrix substrate formed with a pixel portion and a CMOS circuit and the opposing substrate are stuck together through a known assembly process by interposing a sealant or spacers (neither shown in the figure). A liquid crystal material 606 is injected thereafter between both substrates and completely sealed with a sealant (not shown). The liquid crystal material used may be any publicly known liquid crystal material. This completes the active matrix liquid crystal display device shown in FIG. 11.

Then, the structure of this active matrix liquid crystal display device will be explained with reference to the perspective view in FIG. 12 and the top view in FIG. 13. The same numerals are used in FIGS. 12 and 13 for correspondence with the cross-sectional structural diagrams of FIGS. 1A to 5 and FIG. 11. The cross-sectional structure along E-E' in FIG. 13 corresponds to the cross-sectional diagram of the pixel portion shown in FIG. 5.

Figure 12:
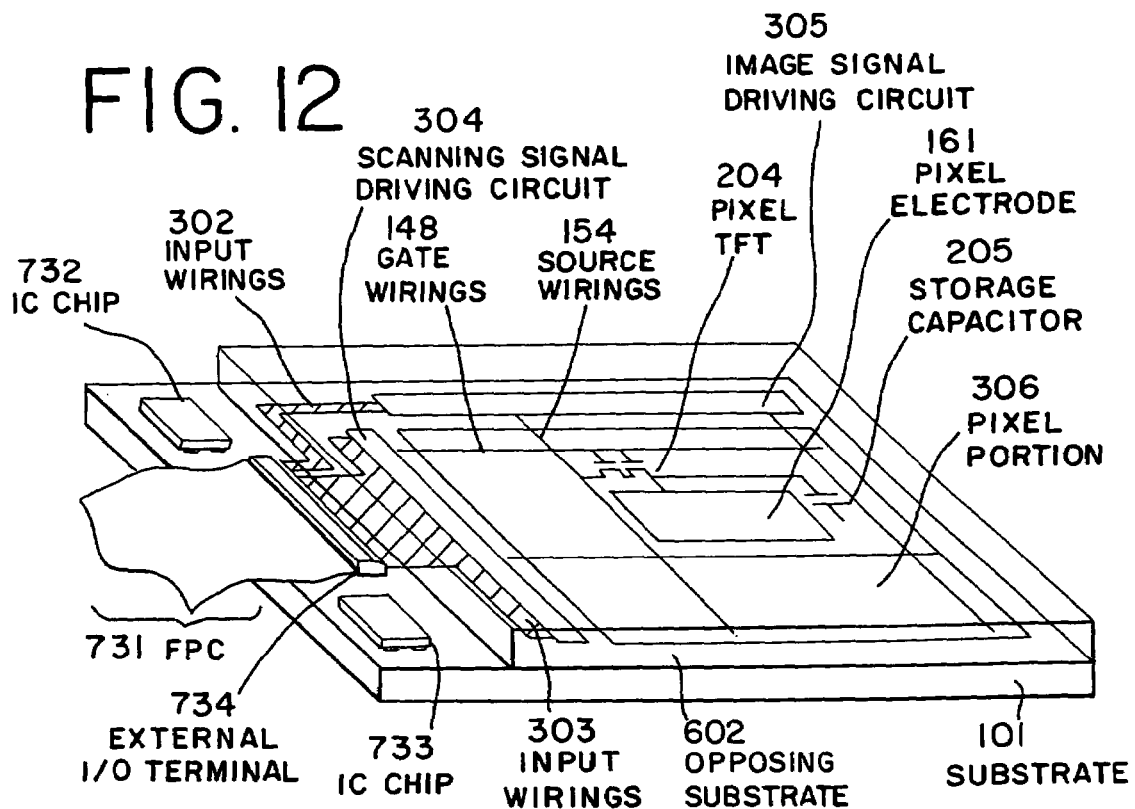
FIG. 12 is a perspective view showing the structure of the liquid crystal display device.

In FIG. 12, the active matrix substrate comprises a pixel portion 306, a scanning signal driving circuit 304 and an image signal driving circuit 305 formed over a glass substrate 101. A pixel TFT 204 is provided in the pixel portion, and the driving circuit provided in the peripheral of the pixel portion basically comprises CMOS circuits. The scanning signal driving circuit 304 and the image signal driving circuit 305 are each connected to the pixel TFT 204 with a gate wiring 148 and source wiring 154. Also, a FPC 731 is connected to an external I/O terminal 734 and is connected to each driving circuit with input wirings 302 and 303.

Figure 13:
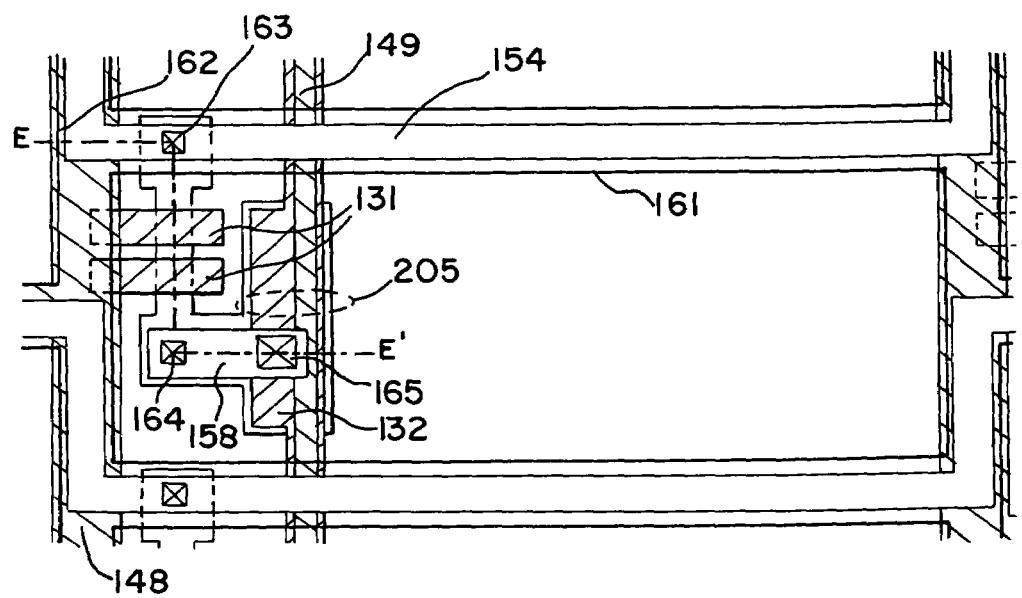
FIG. 13 is a top view showing a pixel portion.

FIG. 13 is a top view showing almost one pixel of the pixel portion 306. The gate wiring 148 crosses with a semiconductor layer 107 underneath by interposing a gate insulating film (not shown). Though not shown in the figure, a source region, a drain region and a $L_{off}$ region formed from n⁻ region are formed in the semiconductor layer. Reference numeral 163 is a contact section of the source wiring 154 and the source region 224, reference numeral 164 is a contact section of the drain wiring 158 and the drain region 226, and 165 is a contact section of the drain wiring 158 and the pixel electrode 161. A storage capacitor 205 is formed in the region where the semiconductor layer 227 extending from the drain region 226 of the pixel TFT 204 overlaps with the capacity wirings 132 and 149 by interposing a gate insulating film.

The active matrix liquid crystal display device of this embodiment was explained with the structure of Embodiment 1, but an active matrix-type liquid crystal display device may also be fabricated using any combination with the construction of Embodiment 2.

Embodiment 5

Figure 10:
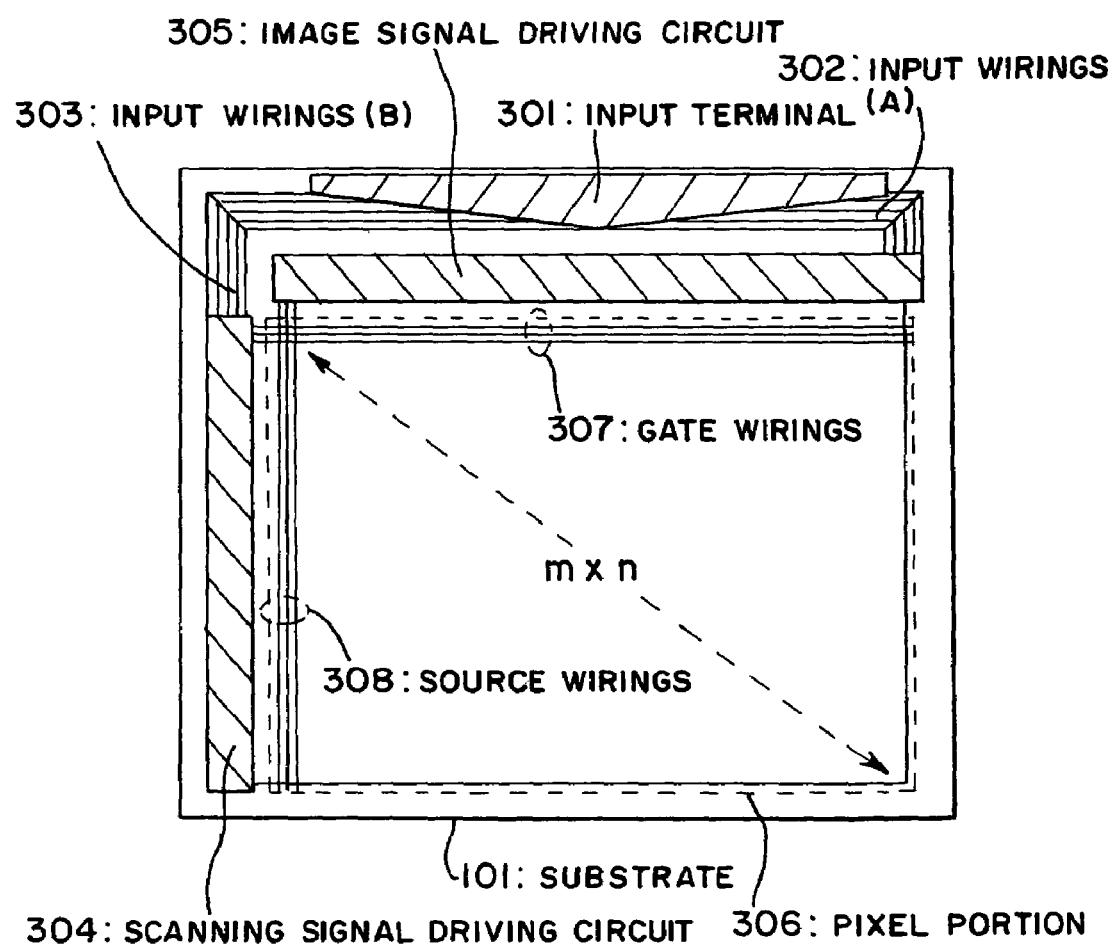
FIG. 10 is a top view showing an input-output terminal of a liquid crystal display device and a wiring circuit arrangement.

FIG. 10 is a diagram showing an example of the arrangement of the I/O terminal, pixel portion and driving circuit of a liquid crystal display device. In the pixel portion 306, m gate wirings and n source wirings are intersected in matrix. For example, when the pixel density is VGA, 480 gate wirings and 640 source wirings are formed, and when the pixel density is XGA, 768 gate wirings and 1024 source wirings are formed. The screen size of the pixel portion has a diagonal length of 340 mm in the case of a 13-inch class display, and 460 mm in the case of an 18-inch class display. In order to realize such a liquid crystal display device, it is necessary to form the gate wirings with a low resistance material as indicated in the Embodiments 1 and 2.

A scanning signal driving circuit 304 and an image signal driving circuit 305 are provided in the peripheral of the pixel portion 306. Since the lengths of these gate wirings of the driving circuit will also become necessarily longer with increasing size of the screen of the pixel portion, they are preferably formed of a low resistance material as indicated in Embodiments 1 and 2, in order to realize large-sized screens.

According to the invention, the input wirings 302, 303 connecting from the input terminal 301 to each driving circuit may be formed of the same material as the gate wirings, and they can contribute to the lower wiring resistance.

Embodiment 6

Figure 14:
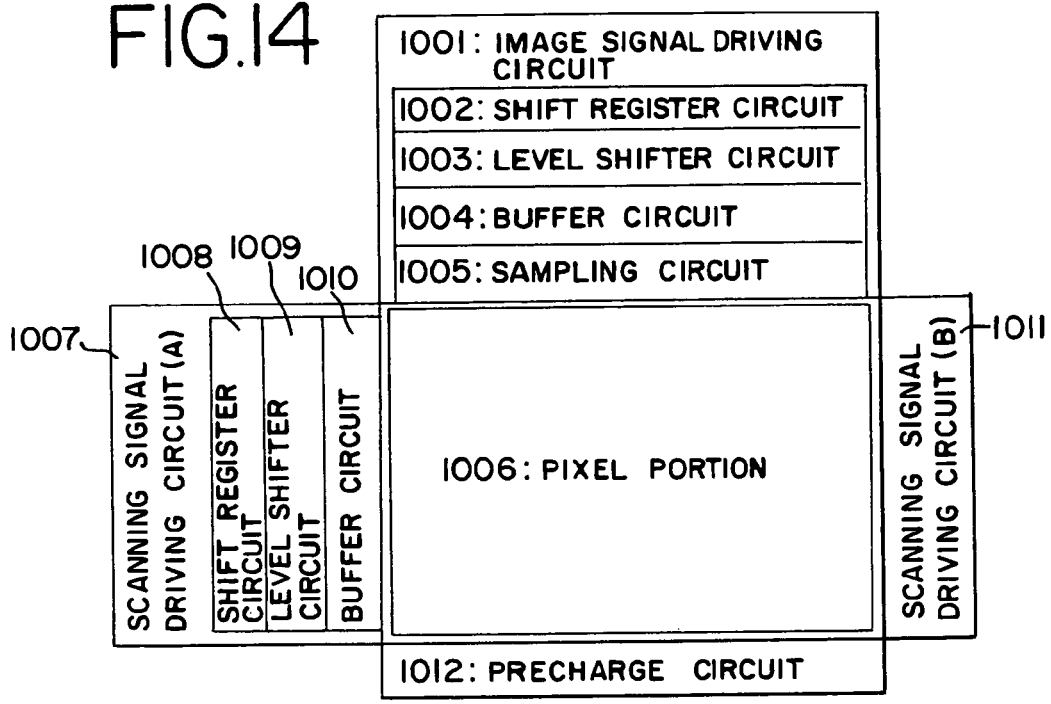
FIG. 14 is a circuit block diagram of a liquid crystal display device.

FIG. 14 shows an example of circuit structure of the active matrix substrate shown in Embodiment 1 or 2, and is a diagram showing a circuit structure of a direct-view type display device. The active matrix substrate of this embodiment has an image signal driving circuit 1001, a scanning signal driving circuit (A) 1007, a scanning signal driving circuit (B) 1011, a pre-charge circuit 1012 and a pixel portion 1006. Throughout this specification, the term "driving circuit" is a generic term including the image signal driving circuit 1001 and the scanning signal driving circuit (A) 1007.

The image signal driving circuit 1001 comprises a shift register circuit 1002, a level shifter circuit 1003, a buffer circuit 1004 and a sampling circuit 1005. The scanning signal driving circuit (A) 1007 comprises a shift register circuit 1008, a level shifter circuit 1009 and a buffer circuit 1010. The scanning signal driving circuit (B) 1011 also has the similar construction.

The driving voltage of the shift register circuits 1002 and 1008 are 5 to 16 V (typically 10 V), and the n-channel TFT of the CMOS circuit forming this circuit suitably has the structure shown as 202 in FIG. 5. The level shifter circuits 1003 and 1009 and buffer circuits 1004 and 1010 have a driving voltage as high as 14 to 16 V, and a CMOS circuit comprising the n-channel TFT 202 in FIG. 5 is suitable, as for the shift register circuit. In these circuits, formation of the gates with a multigate structure is effective for enhancing the voltage resistance and improving the circuit reliability.

The sampling circuit 1005 has a driving voltage of 14 to 16 V, but since it is necessary to reduce the off-current value while driving is performed with an alternating reverse polarity, a CMOS circuit containing the n-channel TFT 203 in FIG. 5 is suitable. FIG. 5 shows only an n-channel TFT, but in an actual sampling circuit it is formed in combination with a p-channel TFT. Here, the p-channel TFT is adequate with the construction shown by 201 in the same drawing.

The pixel TFT 204 has a driving voltage of 14 to 16 V, and from the standpoint of reduced power consumption, a further reduction in the off-current value compared to the sampling circuit is required, and therefore the structure preferably has an LDD ($L_{off}$) region provided without overlapping of the gate electrodes in the manner of the pixel TFT 204.

The construction of this embodiment may be easily realized by fabricating the TFT according to the steps indicated in Embodiment 1. In this embodiment there is only shown the construction for the pixel portion and the driving circuit, but by following the steps of Embodiment 1, it is possible to form a signal processing circuit such as a signal dividing circuit, frequency divider circuit, D/A converter, γ-correction circuit, operational amplifier circuit, signal processing circuit such as a memory circuit or an operation processing circuit, or a logic circuit, on the same substrate. Thus, the present invention can realize a semiconductor device comprising a pixel portion and its driving circuit on the same substrate, for example, a semiconductor device equipped with a signal driving circuit and a pixel portion.

Embodiment 7

Examples of various wiring structures which formed on an insulating surface by using the present invention are shown in FIG. 17. FIG. 17(A) shows a cross sectional view of a single layer structure wiring made from a material 1701 having tungsten as its main constituent and formed on a film (or a substrate) 1700 having an insulating surface. This wiring is formed by patterning a film formed using a target with a purity of 6N and a single gas, argon (Ar), as the sputtering gas. Note that the stress is controlled by setting the substrate temperature 300° C. or less, and by setting the sputtering gas pressure from 1.0 Pa to 3.0 Pa, and other conditions (such as the sputtering power) may be suitably determined by the operator.

Although the wiring 1701 thus obtained contains argon within the wiring material, it contains nearly no other impurity elements, and in particular the amount of sodium contained is 0.3 ppm or less, preferably, 0.1 ppm or less, and the oxygen concentration can be made equal to or less than 1 wt %, preferably equal to or less than 0.2 wt %. In addition, the electrical resistivity can be made equal to or less than 40

μΩ·cm, preferably equal to or less than 20 μΩ·cm, and typically between 6 μΩ·cm and 15 μΩ·cm. Further, the film stress can be controlled to within the range of $-5 \times 10^{10}$ to $5 \times 10^{10}$ dyn/cm$^2$, and the electrical resistivity does not change even after heat treatment at 800 C.

Figure 17A:
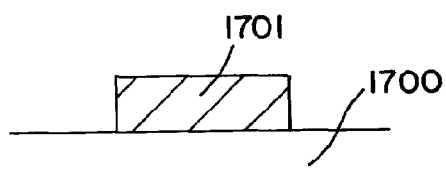
FIG. 17 are cross sectional views showing the structure of a wiring.
Figure 17D:
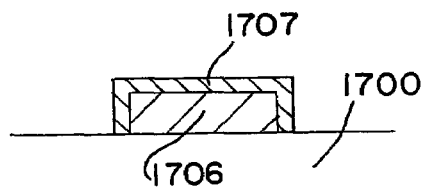
Figure 17B:
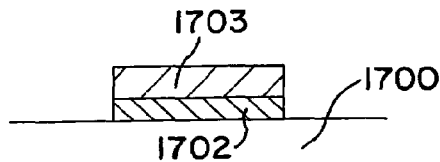

FIG. 17(B) shows a two layer structure. Note that tungsten nitride (WN$_x$) is taken as the lower layer, and that tungsten is taken as the upper layer. Also note that the thickness of a tungsten nitride film 1702 may be set from 10 to 50 nm (preferably between 10 and 30 nm), and that the thickness of a tungsten film 1703 may be set from 200 to 400 nm (preferably between 250 and 350 nm). The two films are laminated in succession, without exposure to the atmosphere, using sputtering in Embodiment 7.

Figure 17E:
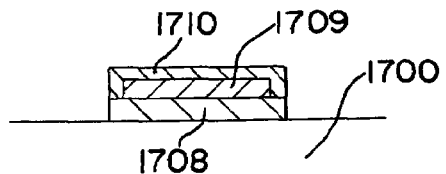
Figure 17C:
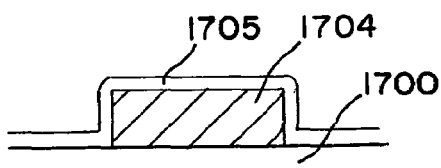

FIG. 17(C) is an example of covering a wiring 1704 made from a material having tungsten as its main component, and formed on the film (or substrate) 1700 having an insulating surface, by an insulating film 1705. The insulating film 1705 may be formed by a silicon nitride film, a silicon oxide film, a silicon nitride oxide film SiO$_x$N$_y$ (where 0<x, and y<1), or a lamination film of a combination of these films.

FIG. 17(D) is an example of covering the surface of a wiring 1706 made from a material having tungsten as its main component, and formed on the film (or substrate) 1700 having an insulating surface, with a tungsten nitride film 1707. Note that if a nitrating process, such as plasma nitrating, is performed on the wiring in the state of FIG. 17(A), then the structure of FIG. 17(D) can be obtained.

FIG. 17(E) is an example of surrounding a wiring 1709 made from a material having tungsten as its main component, and formed on the film (or substrate) 1700 having an insulating surface, with tungsten nitride films 1710 and 1708. This structure is identical to the shape shown in Embodiment 3. Note that if a nitrating process, such as plasma nitrating, is performed on the wiring in the state of FIG. 17(B), then the structure of FIG. 17(E) can be obtained.

Figure 17F:
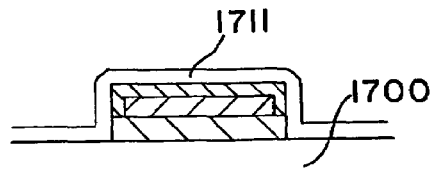

FIG. 17(F) is an example of covering with an insulating film 1711, after forming the state of FIG. 17(E). The insulating film 1711 may be formed by a silicon nitride film, a silicon oxide film, a silicon nitride oxide film, or a lamination film of a combination of these films.

The present invention can thus be applied to various wiring structures. It is possible to freely combine the constitution of Embodiment 7 with the constitution shown in any of Embodiments 1 to 6.

Embodiment 8

Figure 18:
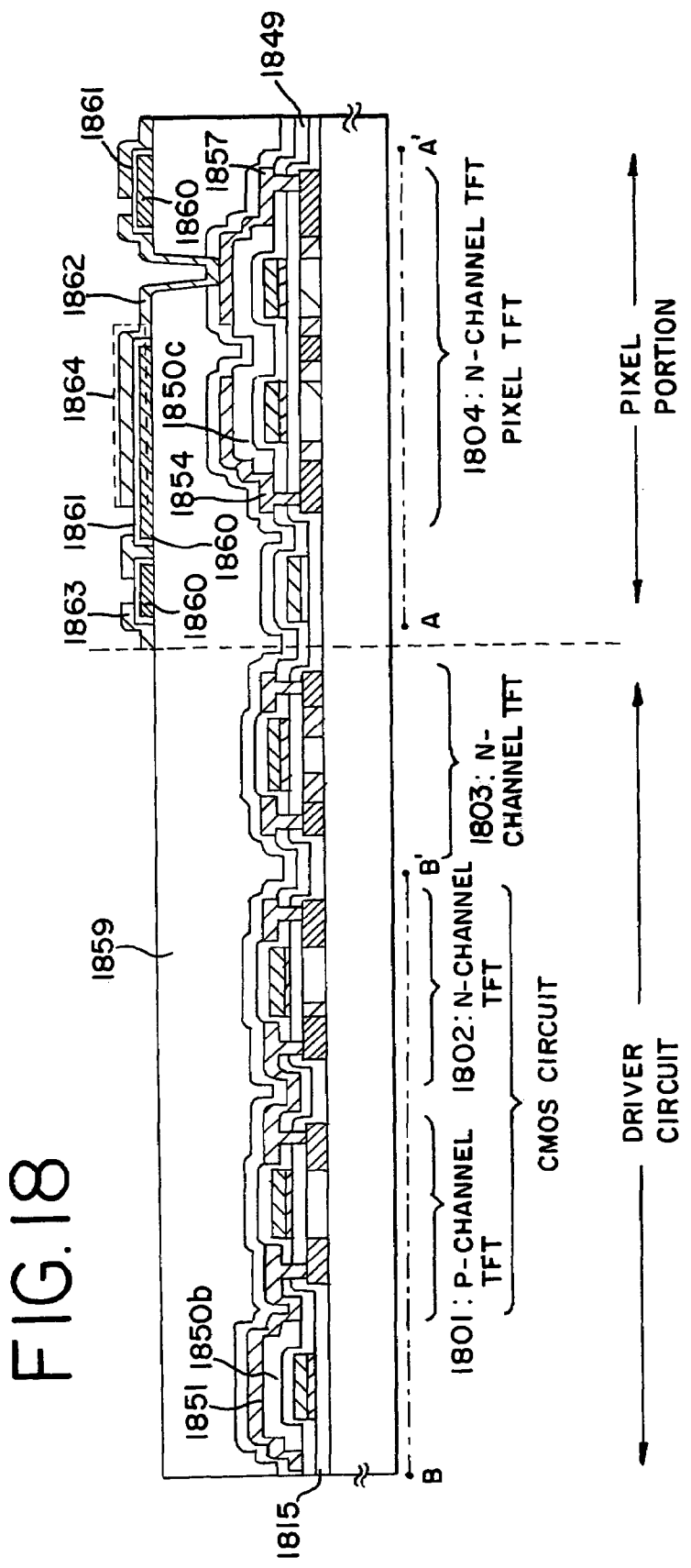
FIG. 18 is a cross sectional view of a pixel TFT, a storage capacitor, and a driving circuit TFT.

Using FIGS. 18 to 20, Embodiment 8 shows a structure of an active matrix substrate in which the parasitic capacitance is reduced by forming a second interlayer insulating film in a region in which a gate wiring and an upper wiring overlap, in an active matrix type liquid crystal display device with a diaganol equal to or less than 1 inch. Note that the basic structure is identical to the structure recorded in Japanese Patent Application No. Hei 11-154432, by the applicant of the present invention.

As shown in FIG. 18, in order to increase the aperture ratio in Embodiment 8, a structure is used in which a portion of a gate electrode, or the entire gate electrode, overlapping a channel forming region of an n-channel TFT 1804 comprising a pixel TFT, overlaps second wirings (source lines or drain lines) 1854 and 1857. Further, a first interlayer insulating film 1849 and a second interlayer insulating film 1850c are formed between the gate electrode and the second wirings 1854 and 1857, reducing the parasitic capacitance. Note that the second interlayer insulating film 1850c is selectively formed only in the region in which the gate electrode and the second wirings overlap.

In FIG. 18, reference numeral 1859 denotes a third interlayer insulating film, 1860 denotes a light shielding film, and 1861 denotes an oxide formed by anodic oxidation or plasma oxidation (anodic oxidation is used in Embodiment 8) on the surface of the light shielding film 1860. Further, reference numeral 1862 denotes a pixel electrode made from an indium tin oxide (ITO) film. Note that a pixel electrode 1863 is an adjoining pixel electrode of another pixel.

Further, the pixel electrode 1862 and the light shielding film 1860 overlap through the anodic oxide 1861, constituting a storage capacitor 1864. Note that it is preferable to set the light shielding film 1860 to a floating state (an electrically isolated state) or to a fixed electric potential, preferably a common electric potential (an intermediate electric potential of a pixel signal sent as data).

Figure 19A:
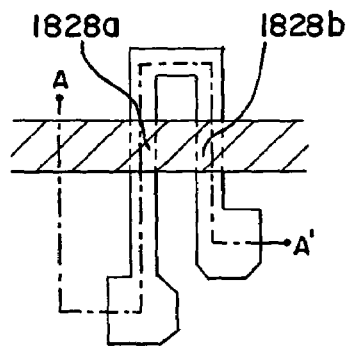
FIG. 19 are one portion of a top view of the pixel TFT.
Figure 19B:
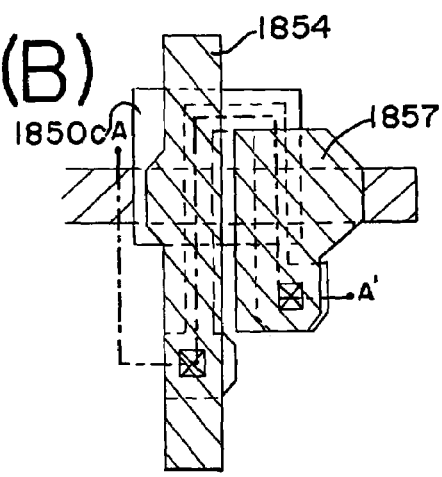

FIG. 19(B) shows a portion of a top view of a pixel portion directly after forming the second wirings (source lines or drain lines) 1854 and 1857, using common symbols. Further, FIG. 19(A) is a top view directly after forming the gate wirings.

Figure 20A:
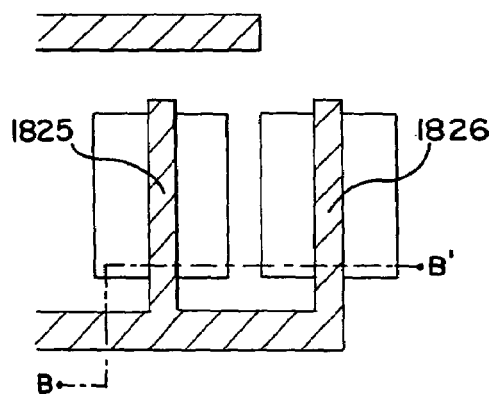
FIG. 20 are top views of the driving circuit TFT.
Figure 20B:
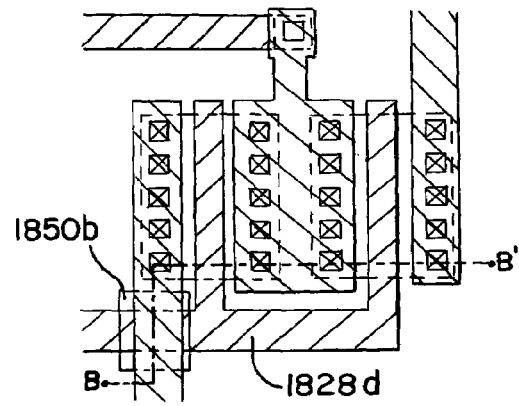

Furthermore, a second interlayer insulating film 1850b may be selectively formed in a region in which a gate wiring formed on an insulating film 1815 and a second wiring 1851 intersect in a driving circuit comprising a p-channel TFT 1801, an n-channel TFT 1802, and an n-channel TFT 1803 and the like. Note that a top view of a driving circuit corresponding to FIG. 18 is shown in FIG. 20(B) using common symbols. Further, FIG. 20(A) is a top view directly after forming the gate wiring.

The gate wirings of the TFTs 1801 to 1804 shown in FIG. 18 are lamination structures of the tungsten nitride film 1702 and the tungsten film 1703. By using the sputtering method shown in the embodiment mode, the amount of sodium contained in the gate wirings can be made equal to or less than 0.3 ppm, preferably equal to or less than 0.1 ppm, the concentration of oxygen within the wirings can be made equal to or less than 1 wt %, preferably equal to or less than 0.2 wt %, and the electrical resistivity of the wirings can be made from 6 to 15 μΩ·cm. Further, the film stress can be controlled within the range of $-1 \times 10^{10}$ dyn/cm$^2$ to $1 \times 10^{10}$ dyn/cm$^2$.

By thus using the sputtering method shown in the embodiment mode, a wiring having low resistance and high reliability can be obtained, and the operating performance and the reliability of the TFT can be greatly increased.

Embodiment 9

A case of applying the present invention to a reflecting type liquid crystal display device manufactured on a silicon substrate is explained in Embodiment 9. As a substitute for the active layer made from the crystalline silicon film in Embodiment 1, an impurity element for imparting n-type or p-type conductivity is added directly into a silicon substrate (silicon wafer), and the TFT structure may be realized. Further, the structure is reflecting type, and therefore a metallic film having a high reflectivity (for example, aluminum, silver, or an alloy of these (an Al—Ag alloy)) and the like may be used as a pixel electrode.

Note that it is possible to freely combine the constitution of Embodiment 9 with the constitution of any of Embodiments 1 to 8.

Embodiment 10

It is possible to use the present invention when forming an interlayer insulating film on a conventional MOSFET, and then forming a TFT on that. In other words, it is possible to realize a semiconductor device with a three dimensional structure. Further, it is possible to use an SOI substrate such as SIMOX, Smart-Cut (a trademark of SOITEC corporation), or ELTRAN (a trademark of Canon Kabushiki Kaisha)

Note that it is possible to freely combine the structure of Embodiment 10 with the structure of any of Embodiments 1 to 9.

Embodiment 11

It is possible to apply the present invention to an active matrix EL display. An example of this is shown in FIG. 21.

Figure 21:
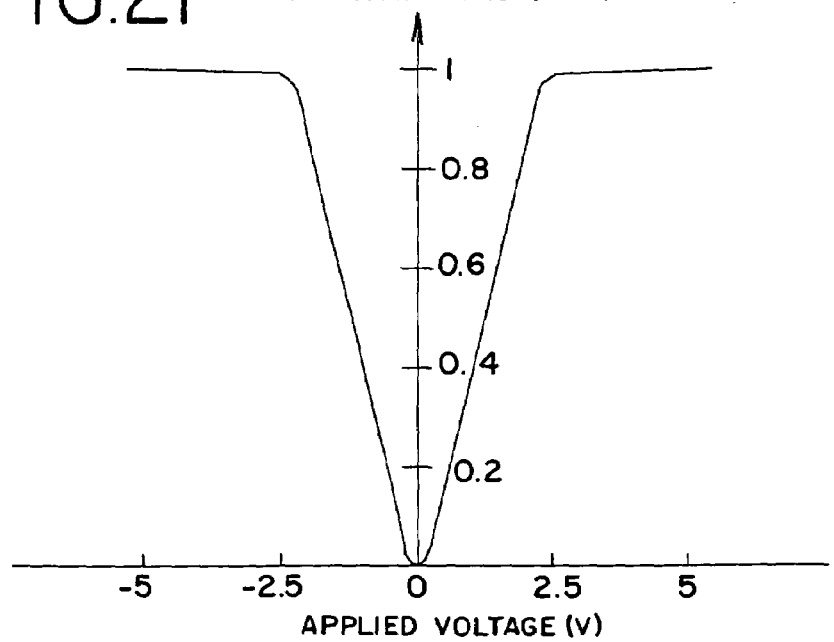
FIG. 21 is a diagram showing the constitution of an active matrix type EL display device.

FIG. 21 is a circuit diagram of an active matrix EL display. Reference numeral 11 denotes a pixel portion, and an x-direction driving circuit 12 and a y-direction driving circuit 13 are formed in its peripheral. Further, each pixel in the pixel portion 11 comprises a switching TFT 14, a storage capacitor 15, a current controlling TFT 16, and an organic EL element 17, and the switching TFT 14 is connected to x-direction signal lines 18a (or 18b) and to y-direction signal lines 19a (or 19b, 19c). Furthermore, power supply lines 20a and 20b are connected to the current controlling TFT 16.

In an active matrix EL display of the present embodiment, TFTs used in an x-direction driving circuit 12 and a y-direction driving circuit 13 are formed by combining p-channel TFT 201 and n-channel TFT 202 or 203 of FIG. 5. The TFTs for switching TFT 14 and a current controlling TFT 16 are formed by n-channel TFT 204 of FIG. 5.

It is possible to freely combine the constitutions of Embodiment 11 with any constitution of Embodiments 1 to 10.

Embodiment 12

It is possible to use a variety of liquid crystal materials in a liquid crystal display device manufactured in accordance with the present invention. The following can be given as examples of such materials: a TN liquid crystal; PDLC (polymer diffusion type liquid crystal); an FLC (ferroelectric liquid crystal); an AFLC (antiferroelectric liquid crystal); and a mixture of an FLC and an AFLC.

For example, the liquid crystal materials disclosed in: H. Furue et al., "Characteristics and Driving Scheme of Polymer-stabilized Monostable FLCD Exhibiting Fast Response Time and High Contrast Ratio with Gray-scale Capability," SID, 1998; in T. Yoshida et al., "A Full-color Thresholdless Antiferroelectric LCD Exhibiting Wide Viewing Angle with Fast Response Time," SID 97 Digest, 841, 1997; and in U.S. Pat. No. 5,594,569 can be used.

In particular, if an antiferroelectric liquid crystal material with no threshold value (thresholdless antiferroelectric LCD: abbreviated TL-AFLC) is used, then there are cases where power supply voltage is around 5 to 8 V because the liquid crystal operating voltage may be reduced to approximately ±2.5 V. Namely, it becomes possible to operate a driving circuit and a pixel portion at the same power supply voltage, and the entire liquid crystal display device can be made low power consumption.

Further, some of the thresholdless-antiferroelectric liquid crystal show electro-optical response characteristics of V shape, and there has been found among them ones the driving voltage of which is about ±2.5 V (with cell thickness of about 1 μm to 2 μm).

Figure 22:
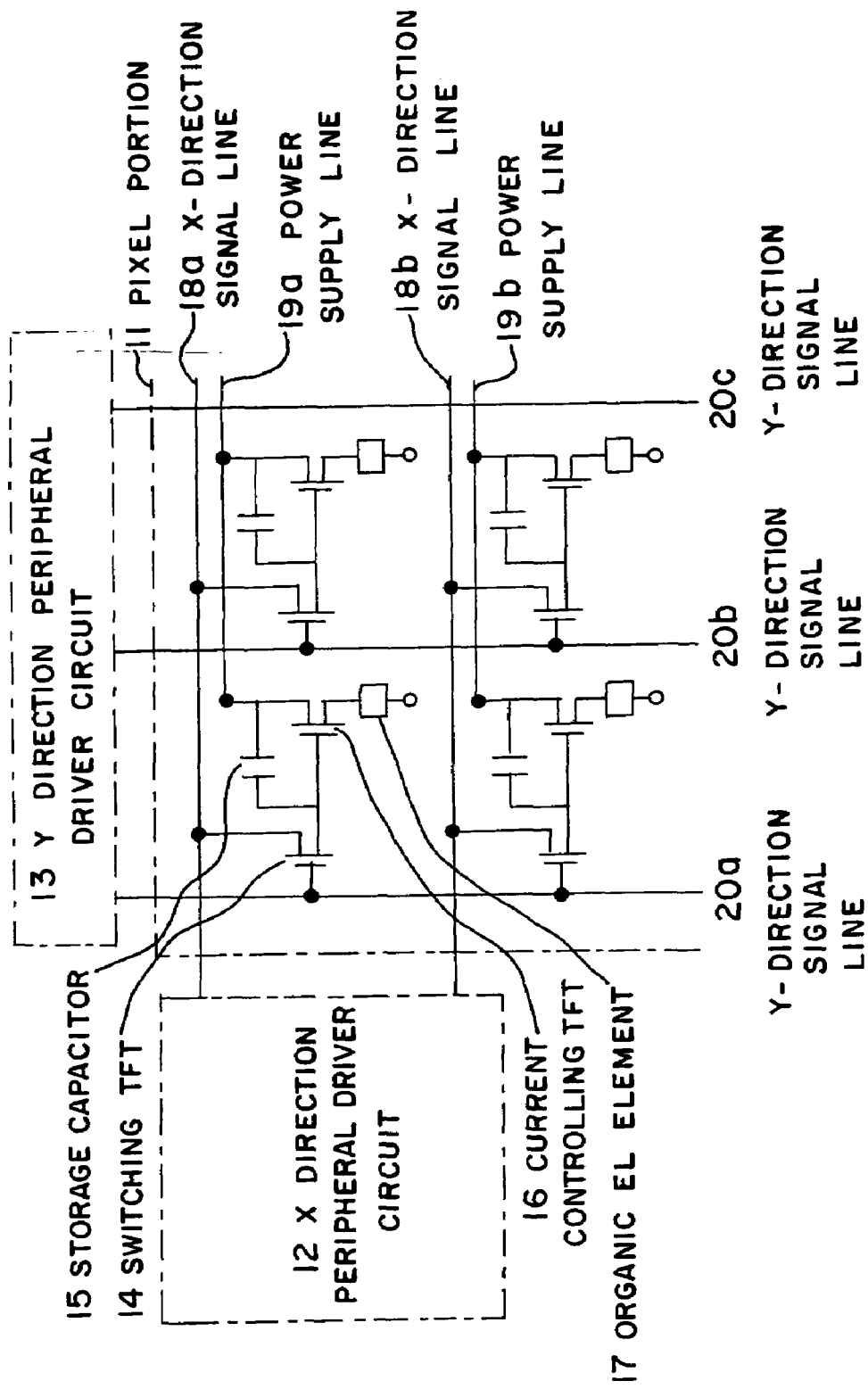
FIG. 22 is a graph showing the light transmissivity characteristics of a thresholdless anti-ferroelectric compound liquid crystal with respect to applied voltage.

An example of characteristics in terms of its light transmittance with respect to the applied voltage of the thresholdless-antiferroelectric mixed liquid crystal that exhibits electro-optical response characteristics of V shape is shown in FIG. 22. In the graph shown in FIG. 22, the axis of the ordinate indicates transmittance (in arbitrary unit) and the axis of abscissa indicates applied voltage. A transmission axis of a polarizing plate on the incident side of a liquid crystal panel is set substantially in parallel with the normal line direction of a smectic layer of the thresholdless-antiferroelectric mixed liquid crystal which substantially coincides with the rubbing direction of the liquid crystal display device. Further, a transmission axis of the polarizing plate on the emission side is set so as to substantially form crossed Nicol to the transmission axis of the polarizing plate on the incident side.

Further, ferroelectric liquid crystals and anti-ferroelectric liquid crystals possess an advantage in that they have a high response time compared to TN liquid crystals. It is possible to realize an extremely fast operating speed TFT for a crystalline TFT such as one used by the above embodiment, and therefore it is possible to realize a liquid crystal display device with fast image response speed by sufficiently utilizing the fast response speed of ferroelectric liquid crystals and antiferroelectric liquid crystals.

Note that the liquid crystal display device of the present embodiment is of course effective when used as an image display of electronic devices such as a personal computer.

Further, it is possible to freely combine the structure of this embodiment with the structure of any of embodiments 1 to 10.

Embodiment 13

TFTs formed in accordance with the present invention can be used in various electro-optical devices. In other words, the present invention can be applied to all of the electronic devices having these electro-optical devices as the display section.

The following can be given as examples of this type of electronic devices: video cameras; digital cameras; head mounted displays (goggle type display); wearable displays; car navigation systems; personal computers; portable information terminals (such as mobile computers, portable telephones and electronic books). Some examples of these are shown in FIG. 23.

Figure 23A:
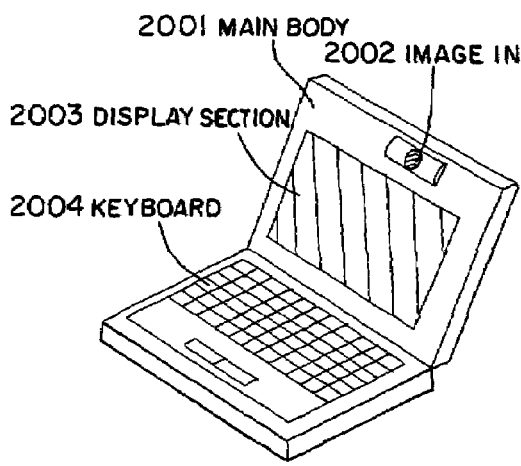
FIG. 23 are diagrams showing an example of electronic devices.

FIG. 23(A) is a personal computer, which comprises: a main body 2001; an image input section 2002; a display section 2003; and a keyboard 2004. The present invention may be applied to the image input section 2002, display section 2003 or other signal driving circuits.

Figure 23B:
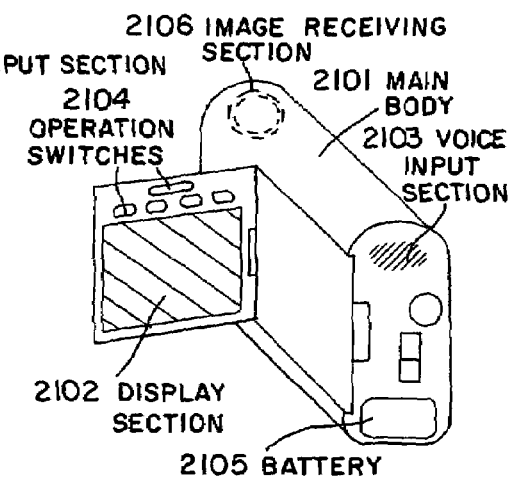

FIG. 23(B) is a video camera, which comprises: a main body 2101; a display section 2102; a voice input section 2103; operation switches 2104; a battery 2105; and an image receiving section 2106. The present invention can be applied to the display section 2102, the voice input section 2103 or other signal driving circuits.

Figure 23C:
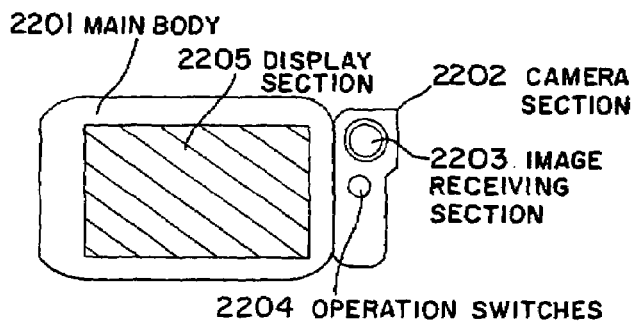

FIG. 23(C) is a mobile computer, which comprises: a main body 2201; a camera section 2202; an image receiving section 2203; operation switches 2204; and a display section 2205. The present invention can be applied to the display section 2205 and other signal driving circuits.

Figure 23D:
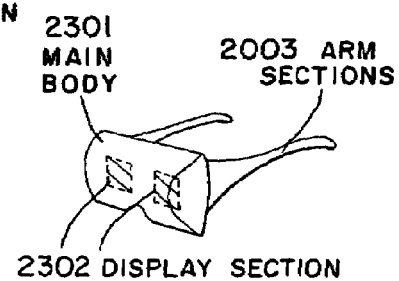

FIG. 23(D) is a goggle type display, which comprises: a main body 2301; display sections 2302; and arm sections 2303. The present invention can be applied to the display section 2302 and other signal driving circuits.

Figure 23E:
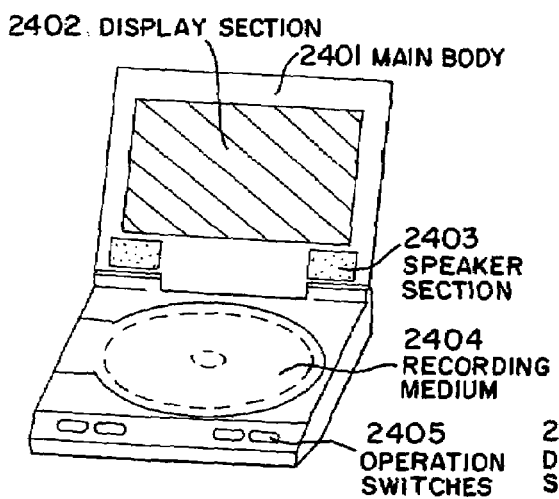

FIG. 23(E) is a player that uses a recording medium on which a program is recorded (hereinafter referred to as a recording medium), which comprises: a main body 2401; a display section 2402; a speaker section 2403; a recording medium 2404; and operation switches 2405. Note that music appreciation, film appreciation, games, and the use of the Internet can be performed with this device using a DVD (digital versatile disk), a CD, etc., as a recording medium. The present invention can be applied to the display section 2402, and to other signal driving circuits.

Figure 23F:
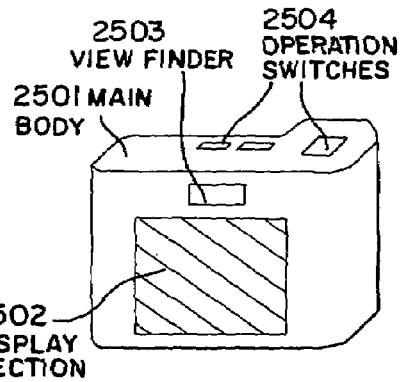

FIG. 23(F) is a digital camera, which comprises: a main body 2501; a display section 2502; a viewfinder 2503; operation switches 2504; and an image receiving section (not shown in the figure). The present invention can be applied to the display section 2502 and to other signal driving circuits.

As described above, the applicable range of the present invention is extremely wide, and it is possible to apply the present invention to electronic devices in all fields. Further, an electronic device of the present invention can be realized by using constitutions of any combination of Embodiments 1 to 12.

Embodiment 14

TFTs formed in accordance with the present invention can be used in various electro-optical devices. In other words, the present invention can be applied to all of the electronic devices having these electro-optical devices as the display section.

As such electronic devices, projectors (rear type or front type) or the like can be given. Examples are shown in FIG. 24.

FIG. 24(A) is a front type projector, which comprises a display device 2601 and a screen 2602, etc. The present invention can be applied to the display device or to other signal driving circuits.

FIG. 24(B) is a rear type projector, which comprises: a main body 2701; a display device 2702; a mirror 2703 and a screen 2704, etc. The present invention can be applied to the display device or other signal driving circuits.

Note that FIG. 24(C) is a drawing showing one example of the structure of the display devices 2601 and 2702 from FIGS. 24(A) and 24(B). The display devices 2601 and 2702 comprise: an optical light source system 2801; mirrors 2802 and 2804 to 2806; dichroic mirror 2803; a prism 2807; a liquid crystal display device 2808; phase differentiating plate 2809; and an optical projection system 2810. The optical projection system 2810 comprise an optical system including a projection lens. The present Embodiment shows an example of triple stage, but there are no special limits and a single stage is acceptable, for example. Further, the operator may set optical systems such as optical lenses, film having polarizing function, film to regulate the phase difference, IR films, etc., suitably within the optical path shown by an arrow in FIG. 24(C).

In addition, FIG. 24(D) shows one example of the structure of the optical light source system 2801 of FIG. 24(C). In the present Embodiment, the optical light source system 2801 comprises: a reflector 2811; a light source 2812; lens arrays 2813 and 2814; a polarizing conversion element 2815; and a condensing lens 2816. Note that the optical light source system shown in FIG. 24(D) is merely an example and is not specifically limited to this structure. For example, the operator may suitably place optical lenses, film having polarizing function, film to regulate the phase difference, IR films, etc.

As shown above, the applicable range of the present invention is extremely wide, and it is possible to apply the present invention to electronic devices in all fields. Further, an electronic device of the present invention can be realized by using structure of any combination of embodiments 1 to 8 and 12.

Embodiment 15

Since the present invention is not limited to the TFT structure, it is possible to apply the present invention to a gate wiring, a source wiring, and a drain wiring which have various TFT structures. The present embodiment shows that the present invention is applied to the gate wiring of an inverted stagger type TFT.

Figure 32:
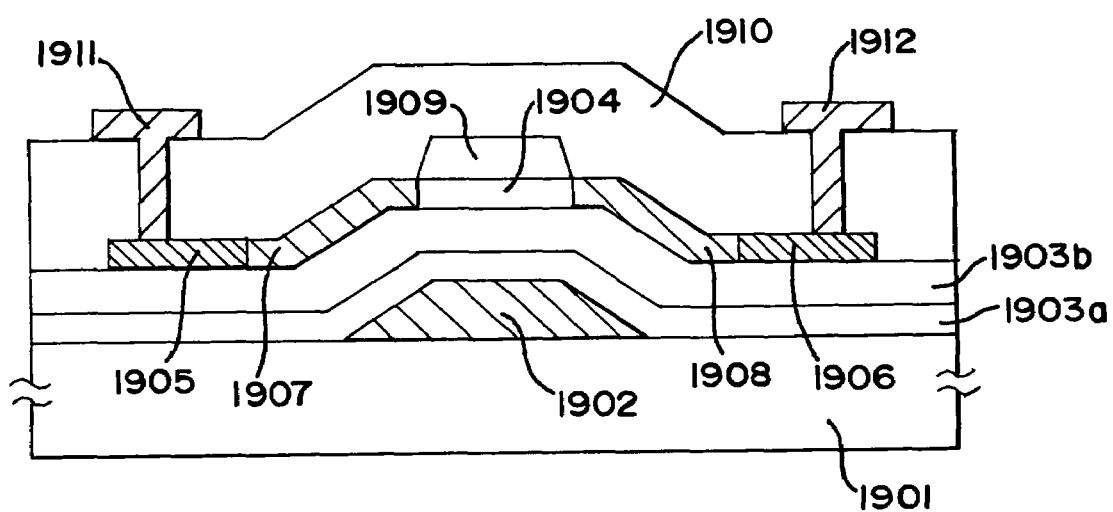
FIG. 32 is a cross sectional view of TFT.

FIG. 32 shows an example of an inverted stagger type TFT. In the FIG. 32, reference numeral 1901 shows a substrate, 1902 shows a gate electrode, 1903a and 1903b show gate insulating films, 1904 shows a channel forming region, 1905 and 1906 show high concentration impurity regions (source region or drain region), 1907 and 1908 show low concentration impurity regions (LDD region), 1909 shows an insulating layer to protect a channel forming region, 1910 shows an interlayer insulating film, 1911 and 1912 show electrodes which connects to a high concentration impurity region (source electrode or drain electrode).

As a forming method of the gate electrode 1902, after forming a conducive film having a thickness of 10 to 1000 nm, preferably, 30 to 300 nm by sputtering, the gate electrode is formed by well-known patterning technique.

Further, gate insulating films 1903a and 1903b having lamination structure are used. As the gate insulating film 1903a which is formed under the gate insulating film 1903b, a silicon nitride film or the like is formed at a thickness of 10 nm to 60 nm to prevent effectively a diffusion of the impurity from a substrate and a gate wiring. Note that the gate insulating film may be a single layer without limiting to the lamination structure.

Note that n-channel type TFT using phosphorus is formed as an impurity element imparting n-type to a semiconductor, instead of the impurity element imparting n-type, p-channel type TFT can be formed by using boron as an impurity element imparting p-type. Also, in this embodiment, an example of forming a low concentration impurity region is denoted, however, it may not be formed if there is no problem in reliability of TFTs.

Further, a film formed by using sputtering of the present invention may be used to form electrodes 1911 and 1912 as well as a gate electrode.

A driving circuit and a pixel portion can be formed by using a basic logical circuit in which such a TFT is used.

Further, it is possible to freely combine this embodiment with any one of Embodiments 1 to 12.

By using the present invention, a wiring can be formed in which the amount of sodium contained in the wiring is 0.03 ppm or less, preferably 0.01 ppm or less, which has a low electrical resistivity (40 $\mu\Omega\cdot$cm or less), and in which the stress is controlled to be $-5\times10^{10}$ to $5\times10^{10}$ dyn/cm$^2$, preferably $-2\times10^{10}$ to $2\times10^{10}$ dyn/cm$^2$, more preferably $-1\times10^{10}$ to $1\times10^{10}$ dyn/cm$^2$.

Furthermore, the wiring of the present invention can maintain the low electrical resistivity (equal to or less than 40 $\mu\Omega\cdot$cm) even if heat treatment is performed at about 800° C.

In addition, by forming a tungsten nitride on the surface of the wiring having tungsten as its main component, a low resistance and high reliability wiring can be obtained, and the operating performance and the reliability of a semiconductor device (specifically, an electro-optical device here) can be greatly increased.

We claim:

1. A method of manufacturing a semiconductor device having a gate electrode comprising the steps of:
    forming a film including tungsten by a sputtering method using simple argon gas as a sputtering gas; and
    patterning the film to form the gate electrode,
    forming a first gate insulating film comprising silicon nitride over the gate electrode;
    forming a second gate insulating film over the first gate insulating film; and
    forming a semiconductor film over the second gate insulating film,
    wherein an amount of sodium contained within the gate electrode is 0.3 ppm or less.

2. The method according to claim 1, wherein the sputtering method uses a tungsten target having a purity of 4N or more.

3. The method according to claim 1, wherein the sputtering method is performed at a substrate temperature of 300° C. or lower.

4. The method according to claim 1, wherein the sputtering method is performed at a gas pressure from 1.0 Pa to 3.0 Pa.

5. The method according to claim 1, wherein a stress of the wiring is within a range of from $-5 \times 10^{10}$ to $5 \times 10^{10}$ dyn/cm$^2$.

6. A method of manufacturing a semiconductor device having a gate electrode comprising the steps of:
    forming a film including tungsten by a sputtering method using simple argon gas as a sputtering gas;
    patterning the film to form the gate electrode;
    forming a first gate insulating film comprising silicon nitride over the gate electrode;
    forming a second gate insulating film over the first gate insulating film;
    forming a semiconductor film comprising a channel forming region over the second gate insulating film; and
    forming an insulating layer to protect the channel forming region over the channel forming region,
    wherein an amount of sodium contained within the gate electrode is 0.3 ppm or less.

7. The method according to claim 6, wherein the sputtering method uses a tungsten target having a purity of 4N or more.

8. The method according to claim 6, wherein the sputtering method is performed at a substrate temperature of 300° C. or lower.

9. The method according to claim 6, wherein the sputtering method is performed at a gas pressure from 1.0 Pa to 3.0 Pa.

10. The method according to claim 6, wherein a stress of the gate electrode is within a range of from $-5 \times 10^{10}$ to $5 \times 10^{10}$ dyn/cm$^2$.

11. A method of manufacturing a semiconductor device having a gate electrode comprising the steps of:
    forming a film including tungsten by a sputtering method using simple argon gas as a sputtering gas;
    patterning the film to form the gate electrode;
    forming a first gate insulating film comprising silicon nitride over the gate electrode;
    forming a second gate insulating film over the first gate insulating film;
    forming a semiconductor film over the second gate insulating film; and
    crystallizing the semiconductor film,
    wherein an amount of sodium contained within the gate electrode is 0.3 ppm or less.

12. The method according to claim 11, wherein the sputtering method uses a tungsten target having a purity of 4N or more.

13. The method according to claim 11, wherein the sputtering method is performed at a substrate temperature of 300° C. or lower.

14. The method according to claim 11, wherein the sputtering method is performed at a gas pressure from 1.0 Pa to 3.0 Pa.

15. The method according to claim 11, wherein a stress of the wiring is within a range of from $-5 \times 10^{10}$ to $5 \times 10^{10}$ dyn/cm$^2$.

16. A method of manufacturing a semiconductor device having a gate electrode comprising the steps of:
    forming a film including tungsten by a sputtering method using simple argon gas as a sputtering gas;
    patterning the film to form a wiring to form the gate electrode;
    forming a first gate insulating film comprising silicon nitride over the gate electrode;
    forming a second gate insulating film over the first gate insulating film;
    forming a semiconductor film over the second gate insulating film; and
    crystallizing the semiconductor film,
    wherein the crystallized semiconductor film comprises:
        a channel forming region;
        a first impurity region having a first impurity concentration; and
        a second impurity region having a second impurity concentration lower than the first impurity concentration between the channel forming region and the first impurity region, and
    wherein an amount of sodium contained within the gate electrode is 0.3 ppm or less.

17. The method according to claim 16, wherein the sputtering method uses a tungsten target having a purity of 4N or more.

18. The method according to claim 16, wherein the sputtering method is performed at a substrate temperature of 300° C. or lower.

19. The method according to claim 16, wherein the sputtering method is performed at a gas pressure from 1.0 Pa to 3.0 Pa.

20. The method according to claim 16, wherein a stress of the gate electrode is within a range of from $-5 \times 10^{10}$ to $5 \times 10^{10}$ dyn/cm$^2$.

* * * * *

UNITED STATES PATENT AND TRADEMARK OFFICE
CERTIFICATE OF CORRECTION

PATENT NO. : 7,226,822 B2 Page 1 of 1
APPLICATION NO. : 10/672521
DATED : June 5, 2007
INVENTOR(S) : Toru Takayama, Keiji Sato and Shunpei Yamazaki It is certified that error appears in the above-identified patent and that said Letters Patent is hereby corrected as shown below:

On The Title Page:

In The Abstract:

Line 8, Change "0.03" to -- 0.3 --.

Line 9, Change "0.01" to -- 0.1 --.

In The Specification:

Column 8, Line 35, Change "0.03" to -- 0.3 --.

Column 24, Line 58, Change "0.03" to -- 0.3 --.

Column 24, Line 59, Change "0.01" to -- 0.1 --.

Signed and Sealed this

Thirtieth Day of October, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,226,822 B2 |
| APPLICATION NO. | : 10/672521 |
| DATED | : June 5, 2007 |
| INVENTOR(S) | : Toru Takayama, Keiji Sato and Shunpei Yamazaki |

Page 1 of 1

It is certified that error appears in the above-identified patent and that said Letters Patent is hereby corrected as shown below:

In The Claims:

Column 25, Claim 5, Line 31, Change "the wiring" to -- the gate electrode --.

Column 26, Claim 15, Line 23, Change "the wiring" to -- the gate electrode --.

Signed and Sealed this

Fourteenth Day of October, 2008

JON W. DUDAS
*Director of the United States Patent and Trademark Office*